(12) United States Patent
Andosca et al.

(10) Patent No.: US 9,502,635 B2
(45) Date of Patent: Nov. 22, 2016

(54) SYMMETRIC DUAL PIEZOELECTRIC STACK MICROELECTROMECHANICAL PIEZOELECTRIC DEVICES

(71) Applicant: MicroGen Systems, Inc., West Henrietta, NY (US)

(72) Inventors: Robert G. Andosca, Fairport, NY (US); Kathleen M. Vaeth, Penfield, NY (US); Didier Lacroix, Los Gatos, CA (US)

(73) Assignee: MicroGen Systems, Inc., West Henrietta, NY (US)

( * ) Notice: Subject to any disclaimer, the term of this patent is extended or adjusted under 35 U.S.C. 154(b) by 262 days.

(21) Appl. No.: 14/201,293

(22) Filed: Mar. 7, 2014

(65) Prior Publication Data
US 2015/0256144 A1 Sep. 10, 2015

(51) Int. Cl.
| | |
|---|---|
| *H01L 41/047* | (2006.01) |
| *H01L 41/053* | (2006.01) |
| *H01L 41/083* | (2006.01) |
| *H01L 41/113* | (2006.01) |
| *H01L 41/09* | (2006.01) |
| *H03H 3/007* | (2006.01) |
| *H03H 9/24* | (2006.01) |
| *H01L 41/08* | (2006.01) |

(52) U.S. Cl.
CPC ............ *H01L 41/09* (2013.01); *H01L 41/083* (2013.01); *H01L 41/0933* (2013.01); *H01L 41/1134* (2013.01); *H03H 3/0072* (2013.01); *H03H 9/2457* (2013.01); *H01L 41/0815* (2013.01)

(58) Field of Classification Search
CPC ...................................... H04R 17/00
USPC .................................... 310/311–371
See application file for complete search history.

(56) References Cited

U.S. PATENT DOCUMENTS

| | | | |
|---|---|---|---|
| 4,445,256 A | 5/1984 | Huguenin et al. | |
| 4,517,486 A * | 5/1985 | Andrews ............. | H03H 3/02 257/418 |
| 5,248,912 A | 9/1993 | Zdeblick et al. | |
| 5,646,583 A | 7/1997 | Seabury et al. | |

(Continued)

FOREIGN PATENT DOCUMENTS

WO     WO 03/096521     11/2003

OTHER PUBLICATIONS

International Search Report for International Patent Application No. PCT/US2014/021905 (Aug. 15, 2014).

(Continued)

*Primary Examiner* — Thomas Dougherty
(74) *Attorney, Agent, or Firm* — LeClairRyan, a Professional Corporation

(57) ABSTRACT

The present invention relates to a device comprising an elongate resonator beam extending between first and second ends. A base is connected to the resonator beam at the first end with the second end extending from the base as a structural layer. The elongate resonator beam comprises either: (1) a first oxide layer on a first piezoelectric stack layer over a structural layer on a second oxide layer over a second piezoelectric stack layer on a third oxide layer or (2) a first oxide layer on a first piezoelectric stack layer over a second oxide layer on a structural layer over a third oxide layer on a second piezoelectric stack over a fourth oxide layer. Also disclosed is a system comprising an apparatus and the device, as well as methods of making and using the device.

37 Claims, 25 Drawing Sheets

(56) References Cited

U.S. PATENT DOCUMENTS

| | | | |
|---|---|---|---|
| 5,708,320 | A | 1/1998 | Ohnishi et al. |
| 6,078,126 | A | 6/2000 | Rollins et al. |
| 6,396,201 | B1 | 5/2002 | Ide et al. |
| 6,796,011 | B2 | 9/2004 | Takeuchi et al. |
| 6,858,970 | B2 | 2/2005 | Malkin et al. |
| 7,839,058 | B1 | 11/2010 | Churchill et al. |
| 7,919,345 | B1 | 4/2011 | Kirsten et al. |
| 8,080,920 | B2 | 12/2011 | Andosca et al. |
| 8,319,402 | B1 | 11/2012 | Churchill et al. |
| 2003/0134738 | A1* | 7/2003 | Furukawa ............. C04B 35/462 501/135 |
| 2003/0214200 | A1 | 11/2003 | Thompson et al. |
| 2004/0115711 | A1 | 6/2004 | Su et al. |
| 2005/0134149 | A1 | 6/2005 | Deng et al. |
| 2005/0205125 | A1 | 9/2005 | Nersessian et al. |
| 2005/0253486 | A1 | 11/2005 | Schmidt |
| 2007/0125176 | A1 | 6/2007 | Liu |
| 2009/0200896 | A1 | 8/2009 | Morris et al. |
| 2009/0284102 | A1 | 11/2009 | Karakaya et al. |
| 2010/0019623 | A1 | 1/2010 | Yao et al. |
| 2010/0072759 | A1 | 3/2010 | Andosca et al. |
| 2010/0194240 | A1 | 8/2010 | Churchill et al. |
| 2010/0295419 | A1* | 11/2010 | Fujii ................... H01L 41/1136 310/339 |
| 2011/0264293 | A1 | 10/2011 | Forrest et al. |
| 2011/0277286 | A1 | 11/2011 | Zhang |
| 2011/0309618 | A1 | 12/2011 | Gieras et al. |
| 2012/0049694 | A1 | 3/2012 | Van Schaijk et al. |
| 2013/0088123 | A1 | 4/2013 | Haskett |
| 2013/0099627 | A1* | 4/2013 | Fujii ...................... H01L 41/04 310/311 |
| 2013/0341936 | A1 | 12/2013 | Wood et al. |
| 2014/0265726 | A1* | 9/2014 | Andosca ............. H01L 41/1136 310/314 |

OTHER PUBLICATIONS

International Search Report for International Patent Application No. PCT/US2014/035296 (Aug. 22, 2014).

International Search Report for International Patent Application No. PCT/US2014/035318 (Dec. 31, 2014).

Altena A, et al., "Design improvements for an electret-based MEMS vibrational electrostatic energy harvester", Journal of Physics: Conference Series 476 (2013) 012078, PowerMEMS2013, pp. 371-374, IOP Publishing.

Andosca R., et al., "Experimental and theoretical studies on MEMS piezoelectric vibrational energy harvesters with mass loading", Sensors and Actuators A: Physical, 2012, pp. 1-12, Elsevier B.V.

Beeby et al., "Energy harvesting vibration sources for microsystems applications," Meas. Sci. Technol., Measurement Science and Technology, 2006, pp. R175-R195, IOP Publishing Ltd.

Elfrink R., et al., "Vaccum Packaged MEMS Piezoelectric Vibration Energy Harvester", PowerMEMS, 2009, pp. 67-70.

Gu L., et al., "Impact-driven, frequency up-converting coupled vibration energy harvesting device for low frequency operation", Smart Mater, Struct., 20, Mar. 8, 2011, pp. 1-10, IOP Publishing.

Marzencki, M., et al., "A MEMS Piezoelectric Vibration Energy Harvesting Device", PowerMEMS, Nov. 28-30, 2005, pp. 45-48.

Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.

Schroder C., et al., "Wafer-Level Packaging of ALN-Based Piezoelectric Micropower Generators", PowerMEMS, Dec. 2-5, 2012, pp. 343-346.

Schroder C., et al., "ALN-Based Piezoelectric Micropower Generator for Low Ambient Vibration Energy Harvesting", 2011,pp. 1-4.

Singh K., et al., "Piezoelectric vibration energy harvesting system with an adaptive frequency tuning mechanism for intelligent tires", Mechatronics 22, Jul. 31, 2012, pp. 970-988, Elsevier, Ltd.

Stoppel et al., "AlN-Based piezoelectric micropower generator for low ambient vibration energy harvesting," Porcedia Engineer. 25, Sep. 4-7, 2011, pp. 721-724, Elsevier, Ltd.

Tang L., et al., "Toward Broadband Vibration-based Energy Harvesting", Journal of Intelligent Material Systems and Structures, vol. 21, Dec. 2010, pp. 1867-1897, Sage Publications.

Schaijk, R., et al., "A MEMS vibration energy harvester for automotive applications", Proc. of SPIE vol. 8763, 2013, pp. 1-10.

Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.

Zhu D., et al., "Strategies for increasing the operating frequency range of vibration energy harvesters: a review", Meas. Sci. Technol. 21, Dec. 15, 2010, pp. 1-29, IOP Publishing.

International Search Report for International Patent Application No. PCT/US2014/014797 (May 23, 2014).

International Search Report for International Patent Application No. PCT/US2013/78520 (May 4, 2014).

International Search Report, corresponding to PCT/US14/65628, mailed Jul. 24, 2015.

European Search Report for European Application No. 13877574.7 (Aug. 1, 2016), pp. 1-6.

International Search Report for International Patent Application No. PCT/US2014/014797 (Aug. 18, 2016), pp. 1-6.

International Preliminary Report on Patentability for International Patent Application No. PCT/US2014/035318 (Sep. 13, 2016), pp. 1-6.

\* cited by examiner

SYMMETRIC DUAL PIEZOELECTRIC STACK MICROELECTROMECHANICAL PIEZOELECTRIC DEVICES

FIELD OF THE INVENTION

The present invention relates to dual piezoelectric stack microelectromechanical piezoelectric devices. More specifically, the present invention relates to dual piezoelectric stack microelectromechanical devices for use as sensors and actuators.

BACKGROUND OF THE INVENTION

Reduction in both size and power consumption of integrated circuits has led to the proliferation of low power sensors and wireless technology. For example, there are a wide variety of devices using low-power sensors, electronics, and wireless transmitters, separately or in combination, including tablets; smartphones; cell phones; laptop computers; MP3 players; telephony headsets; headphones; routers; gaming controllers; mobile internet adaptors; wireless sensors; tire pressure sensor monitors; wearable sensors that communicate with tablets, PCs, and/or smartphones; devices for monitoring livestock; medical devices; human body monitoring devices; toys; etc. These devices may include various microelectromechanical devices to provide a number of different functions. For example, the microelectromechanical devices may include various sensors to monitor and detect environmental conditions such as pressure, vibration, flow rate, strain, physical motion relative to a force (i.e., gravity), impulse motion, or sound. Examples of such sensors include accelerometers, gyroscopes, pressure sensors, strain sensors, flow sensors, and microphones. These devices may further include actuators which provide energy to mechanically drive a system within the device. Additionally, the devices may include energy harvesters that essentially convert movement (e.g., vibrational energy) into electrical energy. Design and manufacturing processes for the microelectromechanical devices vary depending on the application. Further, the various microelectromechanical devices may be distributed through the device in an inefficient manner.

Other wireless technologies of significant interest are wireless sensors and wireless sensor networks. In such networks, wireless sensors are distributed throughout a particular environment to form an ad hoc network that relays measurement data to a central hub. Particular environments include, for example, an automobile, an aircraft, a factory, or a building. A wireless sensor network may include several to tens of thousands of wireless sensor "nodes" that operate using multi-hop transmissions over distances. Each wireless node will generally include a sensor, wireless electronics, and a power source. These wireless sensor networks can be used to create an intelligent environment responding to environmental conditions.

Microelectromechanical ("MEMS") piezoelectric devices with silicon structural layers typically have a cross-section consisting at least of oxide/structural layer/piezoelectric stack/oxide (the oxide is typically deposited silicon dioxide). The silicon material used for the structural layer is typically formed from the single crystalline silicon device layer of a silicon-on-insulator ("SOI") wafer. A second piezoelectric stack is often placed in the device structure to form a dual piezoelectric stack in order to increase the signal output from the device. The additional piezoelectric stack is placed on the same side of the silicon structural layer as the first piezoelectric stack (or on top of the first piezoelectric stack), in the format of at least oxide/structural layer/piezoelectric stack/oxide/piezoelectric stack/oxide. The additional piezoelectric stack is placed in this manner because during the process used to fabricate SOI wafers, direct bonding of two silicon wafers at high temperature, followed by grinding and polishing steps, makes it extremely difficult to place piezoelectric stacks in between the device and handle wafers.

Placement of the additional piezoelectric stack on the same side of the silicon structural layer as the first piezoelectric stack creates a lack of symmetry in cross-section with respect to the piezoelectric stack, requiring the piezoelectric stack residual stress to be tuned in order to engineer the flatness of the structural layer. Curl or lack of flatness in the structural layer due to poor management of residual stress in the layers can impact the performance of the MEMS device. Tuning the residual stress of the piezoelectric stack can also impact its inherent piezoelectric properties and, thus, device performance. A tradeoff must, therefore, be made in the stresses required for structural layer flatness and for quality piezoelectric response.

The present invention is directed to overcoming these and other deficiencies in the art.

SUMMARY OF THE INVENTION

One aspect of the present invention relates to a device comprising an elongate resonator beam extending between first and second ends. A base is connected to the resonator beam at the first end with the second end extending from the base as a structural layer. The elongate resonator beam comprises either: (1) a first oxide layer on a first piezoelectric stack layer over a structural layer on a second oxide layer over a second piezoelectric stack layer on a third oxide layer or (2) a first oxide layer on a first piezoelectric stack layer over a second oxide layer on a structural layer over a third oxide layer on a second piezoelectric stack over a fourth oxide layer.

Another aspect of the present invention relates to a system comprising an apparatus and the device of the present invention coupled to the apparatus.

A further aspect of the present invention relates to a method of measuring an environmental condition. This method involves providing the system according to the present invention and subjecting the system to one or more environmental conditions that generate movement or vibrations to generate electrical energy from the first and/or second piezoelectric stack layer. The environmental condition is measured based on the electrical energy generated from the first and/or second piezoelectric stack layer.

Yet another aspect of the present invention relates to a method for providing a mechanical actuation force. This method involves providing the system according to the present invention and providing a voltage source in electrical connection with the device. A voltage is applied to the device from the voltage source, where the applied voltage initiates motion of the elongate resonator beam. A mechanical actuation force is provided based on the motion of the elongate resonator beam.

Another aspect of the present invention relates to a method of producing a symmetric dual stack microelectromechanical piezoelectric device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A structural layer is deposited over the deposited second silicon dioxide layer and patterned. A second piezoelectric stack layer is deposited over the patterned structural layer and the second piezoelectric stack layer is patterned to produce the device.

The device may be fabricated in a standardized micromachining fabrication process that can be utilized to build a wide variety of microelectromechanical structures, such as sensors and actuators, with enhanced performance Multiple users can separately create designs for the devices and integrate them on the same chip or wafer. The device of the present invention further provides a dual piezoelectric stack device with a symmetric cross-section fabricated using a thick deposited layer of metal, silicon, or other CMOS compatible material for the structural layer, and one piezoelectric stack on either surface of the structural layer. This structure provides increased sensitivity of the device to detect movement and the advantage of nearly independent control of piezoelectric layer material properties and piezoelectric stack stress (and therefore overall beam flatness), which leads to better device performance and a more robust manufacturing process.

DETAILED DESCRIPTION OF THE INVENTION

The present invention relates to a symmetric dual piezoelectric stack MEMS piezoelectric device, a system comprising the device, and methods of using and making the device.

One aspect of the present invention relates to a device comprising an elongate resonator beam extending between first and second ends. A base is connected to the resonator beam at the first end with the second end extending from the base as a structural layer. The elongate resonator beam comprises either: (1) a first oxide layer on a first piezoelectric stack layer over a structural layer on a second oxide layer over a second piezoelectric stack layer on a third oxide layer or (2) a first oxide layer on a first piezoelectric stack layer over a second oxide layer on a structural layer over a third oxide layer on a second piezoelectric stack over a fourth oxide layer.

Figure 1:
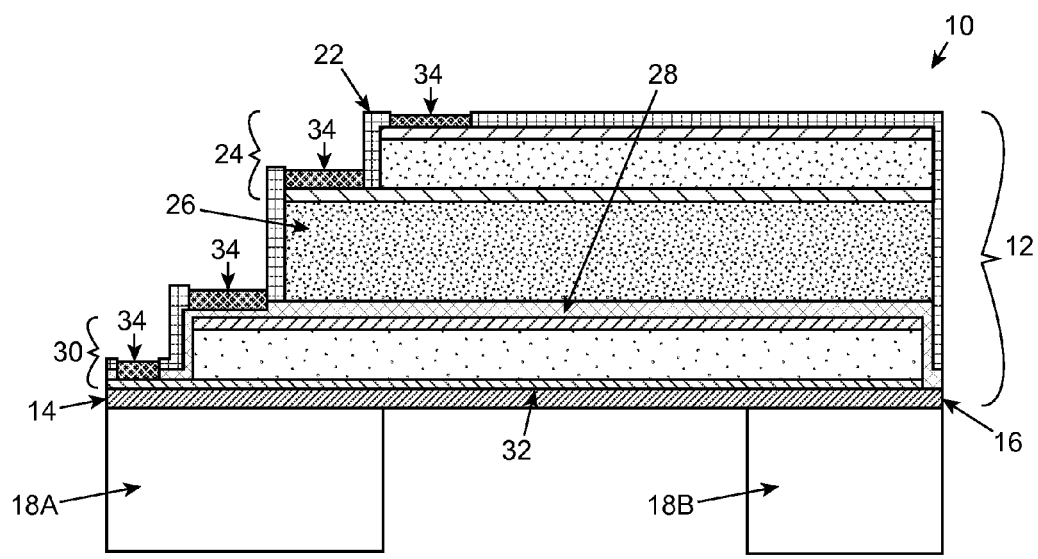
FIG. 1 is a side cross-sectional view of a first embodiment of a device of the present invention with an elongate resonator beam comprising a first oxide layer on a first piezoelectric stack layer over a structural layer on a second oxide layer over a second piezoelectric stack layer on a third oxide layer.

FIG. 1 is a side cross-sectional view of a first embodiment of device 10 of the present invention. Device 10 may be, by way of example only, a sensor, such as an accelerometer, a motion sensor, a vibration sensor, a gyroscope, a pressure sensor, or a strain sensor. Device 10 alternatively may be an actuator to actuate devices such as valves, pumps, or speakers.

Device 10 includes elongate resonator beam 12. Resonator beam 12 extends between first end 14 and second end 16. First base portion 18A is connected to resonator beam 12 at first end 14 and second base portion 18B is connected to resonator beam 12 at second end 16. Second end 16 freely extends from first base portion 18A as a cantilever, and second base portion 18B serves as a mass at the end of resonator beam 12.

Resonator beam 12 comprises a laminate formed by a plurality of layers. According to one embodiment, resonator beam 12 includes at least first oxide layer 22 on first piezoelectric stack layer 24 over structural layer 26 on second oxide layer 28 over second piezoelectric stack layer 30 on third oxide layer 32. Non-limiting examples of other layers include those described below with respect to the method of forming a device of the present invention as shown in FIGS. 8-21C.

First oxide layer 22, according to one embodiment, can be a silicon oxide layer with a thickness of about 1 µm. According to another embodiment, first oxide layer is optional and its presence provides robustness to the structure against abrasion. Second oxide layer 28 is, according to one embodiment, an oxide layer with a thickness of about 1 µm deposited by plasma assisted chemical vapor deposition (PECVD). This layer provides electrical isolation of the second piezoelectric stack layer 30. Third oxide layer 32 can be a thermal oxide layer. In one embodiment, third dioxide layer 32 has a thickness of about 0.25 jam to about 2 µm.

Structural layer 26 may be any suitable non-crystalline material such as silicon, polySi, metal (e.g., Cu or Ni) or other metal oxide semiconductor (CMOS) compatible material, carbon-nano-fiber (CNF), or a high temperature polymer such as polyimide. In one embodiment, structural layer 26 has a thickness range of about 10 µm to about 200 µm, about 10 µm to about 75 µm, or about 10 µm to about 50 µm.

First and second piezoelectric stacks 24 and 30 of the resonator beam 12 include a piezoelectric material. Suitable piezoelectric materials include, without limitation, aluminum nitride, zinc oxide, PVDF, and lead zirconate titinate based compounds. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference (London, UK)* pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} \text{ m/V}$$

(Beeby et al., "Energy Harvesting Vibration Sources for Microsystems Applications," *Meas. Sci. Technol.* 17:R175-R195 (2006), which is hereby incorporated by reference in its entirety).

First and second piezoelectric stacks 24 and 30 of the resonator beam 12 also include one or more electrodes 34 in electrical contact with the first and/or second piezoelectric stack layers 24 and 30. According to one embodiment, electrodes 34 comprise a material selected from the group consisting of molybdenum and platinum, although other materials suitable for forming electrode structures may also be used. In addition, device 10 may further include circuitry in electrical connection with one or more electrodes 34. In one embodiment, the circuitry receives electrical energy from the piezoelectric material and provides an output to the apparatus to measure an environmental condition that causes deflection or deformation of resonator beam 12, such as pressure, vibration, flow rate, strain, physical motion relative to a force (i.e., gravity), impulse motion, or sound. For example, the output may display the strength of the electrical energy as in indication of the strength of the environmental condition. In another embodiment, the circuitry may be electrical harvesting circuitry that can be electrically coupled to an electrically powered apparatus to provide power generated from the piezoelectric material and supplied to the apparatus. In another embodiment, the circuitry can be coupled to a voltage source to apply a voltage in order to cause deflections in the piezoelectric materials.

In this embodiment of the device of the present invention, resonator beam 12 has second end 16, which is freely extending from first base portion 18A as cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of second base portion 18B attached at second end 16 of resonator beam 12.

Resonant frequencies of resonator beam 12 of device 10 of the present invention in operation may include frequencies of about 50 Hz to about 4,000 Hz, about 100 Hz to about 3,000 Hz, about 100 Hz to about 2,000 Hz, or about 100 Hz to about 1,000 Hz.

Resonator beam 12 may have sidewalls that take on a variety of shapes and configurations to help tune resonator beam 12 and to provide structural support. According to one embodiment, resonator beam 12 has sidewalls which are continuously curved within the plane of resonator beam 12, as described in U.S. Provisional Patent Application Ser. No. 61/780,203, which is hereby incorporated by reference in its entirety.

Device 10 of the present invention includes second base portion 18B at second end 16 of resonator beam 12, which serves as a mass when second end 16 of resonator beam 12 is freely extending from first base portion 18A. Second base portion 18B is provided to lower the frequency of resonator beam 12 and also to increase the power output of resonator beam 12 (i.e., generated by the piezoelectric material). Second base portion 18B may be constructed of a single material or multiple materials (e.g., layers of materials). According to one embodiment, second base portion 18B is formed of silicon wafer material. Other suitable materials include, without limitation, copper, gold, and nickel deposited by electroplating or thermal evaporation.

In one embodiment, second base portion 18B is provided as a single mass per resonator beam 12. However, more than one mass may also be attached to resonator beam 12. In other embodiments, such as the embodiment shown in FIG. 2, second base portion 18B is provided, for example, at differing locations along resonator beam 12.

As those skilled in the art will readily appreciate, resonator beam 12 can be tuned by varying any one or more of a number of parameters, such as the cross-sectional shape of resonator beam 12, cross-sectional dimensions of resonator beam 12, the length of resonator beam 12, the mass of second base portion 18B, the location of second base portion 18B on resonator beam 12, and the materials used to make resonator beam 12.

In operation, one or more electrodes 34 output an electrical signal from the piezoelectric materials of resonator beam 12 as resonator beam 12 is subject to movement, such as a deflection or deformation of a portion of resonator beam 12. The movement of resonator beam 12 may be in response to environmental conditions, for example, pressure, vibration, flow rate, strain, physical motion relative to a force (i.e., gravitiy), impulse motion, or sound, although the movement may be related to other environmental conditions that cause a deflection or deformation of a portion of resonator beam 12. Accordingly, electrodes 34 are in electrical connection with the piezoelectric materials of resonator beam 12. Electrical energy collected from the piezoelectric materials of resonator beam 12 is then communicated to additional circuitry. In one embodiment, the additional circuity is formed on device 10 at or near electrodes 34. In another embodiment, the circuitry may be a separate chip or board, or is present on a separate chip or board. In another embodiment, a voltage is applied to one or more electrodes 34 to deflect resonator beam 12 to function as an actuator, such as a valve, pump, or speaker.

Figure 2:
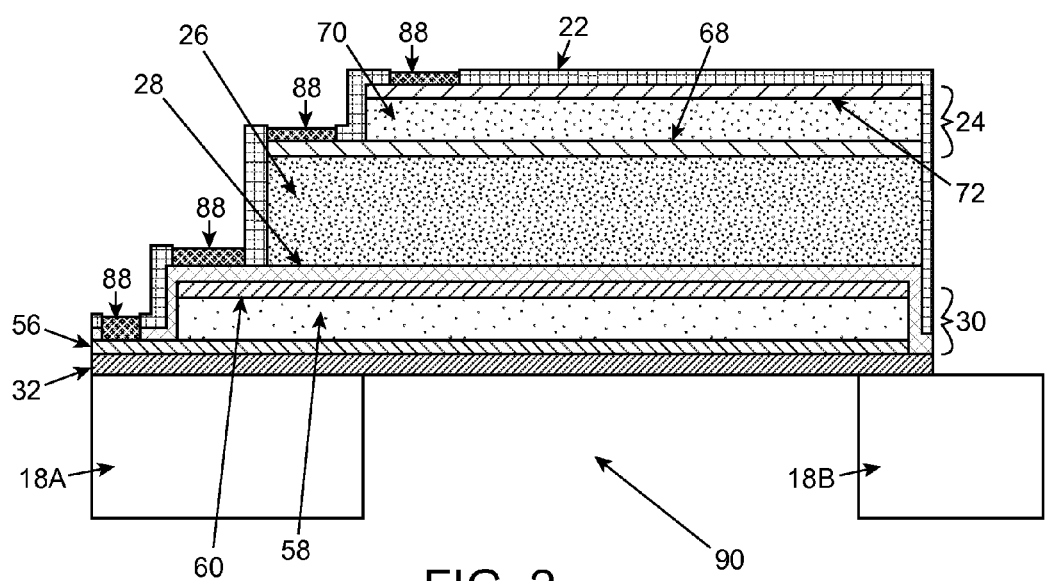
FIG. 2 is a side cross-sectional view of a second embodiment of a device of the present invention with an elongate resonator beam comprising a first oxide layer on a first piezoelectric stack layer over a structural layer on a second oxide layer over a second piezoelectric stack layer on a third oxide layer.

FIG. 2 illustrates a side cross-sectional view of an alternative embodiment of device 10 of the present invention. The structure of device 10 is the same as described above with respect to FIG. 1, except as described below with respect to first base portion 18A and second base portion 18B. Second base portion 18B is located at, and extends beyond, second end 16 of resonator beam 12. Resonator beam 12 is clamped, either fully or partially, to first base portion 18A and the second base portion 18B.

Figure 3:
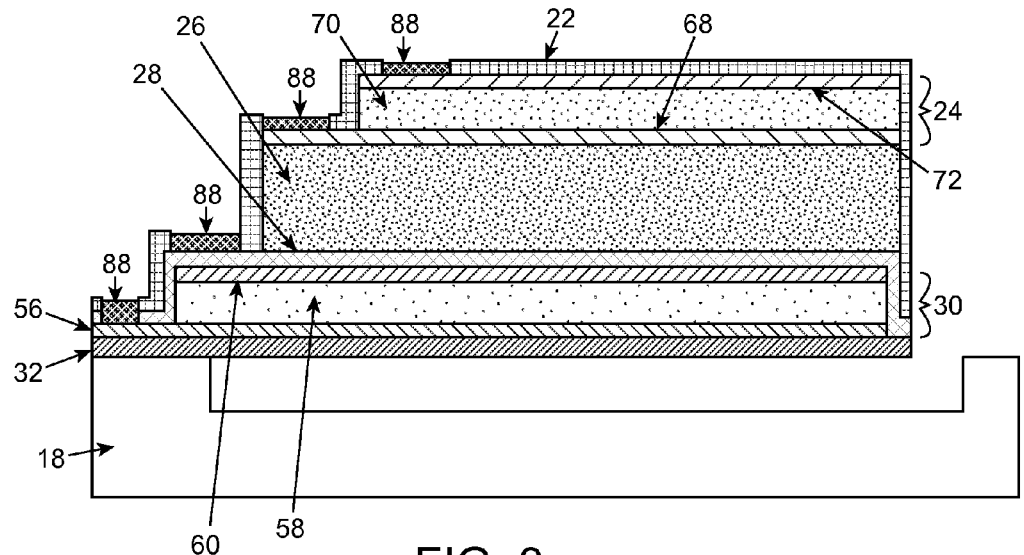
FIG. 3 is a side cross-sectional view of a third embodiment of a device of the present invention with an elongate resonator beam comprising a first oxide layer on a first piezoelectric stack layer over a structural layer on a second oxide layer over a second piezoelectric stack layer on a third oxide layer.

FIG. 3 illustrates a side cross-sectional view of another alternative second embodiment of device 10 of the present invention. The structure of device 10 is the same as described above with respect to FIG. 1, except as described below with respect to base 18. Base 18 extends from first end 14 to second end 16 or resonator beam 12, but is spaced from elongate resonator beam 12 at second end 16.

Figure 4:
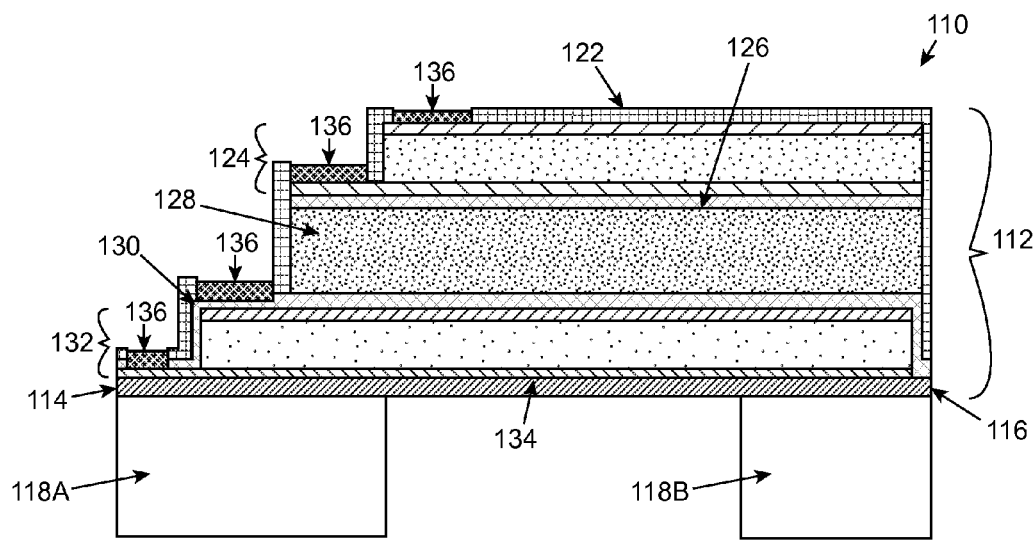
FIG. 4 is a side cross-sectional view of a fourth embodiment of a device of the present invention with an elongate resonator beam comprising a first oxide layer on a first piezoelectric stack layer over a second oxide layer on a structural layer over a third oxide layer on a second piezoelectric stack over a fourth oxide layer.

FIG. 4 illustrates an alternative embodiment of a device of the present invention. Specifically, device 110 includes elongate resonator beam 112. Resonator beam 112 extends between first end 114 and second end 116. First base portion 118A is connected to resonator beam 112 at first end 114. Second base portion 118B is connected to resonator beam 112 at second end 116. In one embodiment, second end 116 freely extends from base 118A as a cantilever. Device 110 is the same as device 10 as described above with respect to FIG. 1, except as described below with respect to resonator beam 112. Specifically, device 110 comprises resonator beam 112, which includes a different layering of materials as described below with respect to FIG. 2.

Resonator beam 112 comprises a laminate formed of a plurality of layers. According to one embodiment, resonator beam 112 includes first oxide layer 122 on first piezoelectric stack 124 layer over second oxide layer 126 on structural layer 128 over third oxide layer 130 on second piezoelectric stack 132 over fourth oxide layer 134. Non-limiting examples of other layers include those described below with respect to the method of forming a device of the present invention as shown in FIGS. 22-37C.

The layers of resonator beam 112 are substantially the same as the layers of resonator beam 12, except as described below with respect to FIG. 4. Specifically, resonator beam 112 includes the addition of second oxide layer 126 between first piezoelectric stack layer 124 and structural layer 128.

Second oxide layer 126 is according to one embodiment, a high temperature oxide layer with a thickness of about 1 μm. This layer provides electrical isolation of the first piezoelectric stack layer 124. Third oxide layer 130 and fourth oxide layer 134 are the same as second oxide layer 28 and third oxide layer 32, respectively, as described above with respect to FIG. 1.

First and second piezoelectric stacks 124 and 132 of resonator beam 112 also include one or more electrodes 136 in electrical contact with the first and/or second piezoelectric stack layers 124 and 132. According to one embodiment, electrodes 136 comprise a material selected from the group consisting of molybdenum and platinum, although other materials suitable for forming electrode structures may also be used. In addition, device 110 may further include circuitry in electrical connection with one or more electrodes 136 to output electrical energy from the piezoelectric material of resonator beam 112.

Figure 5:
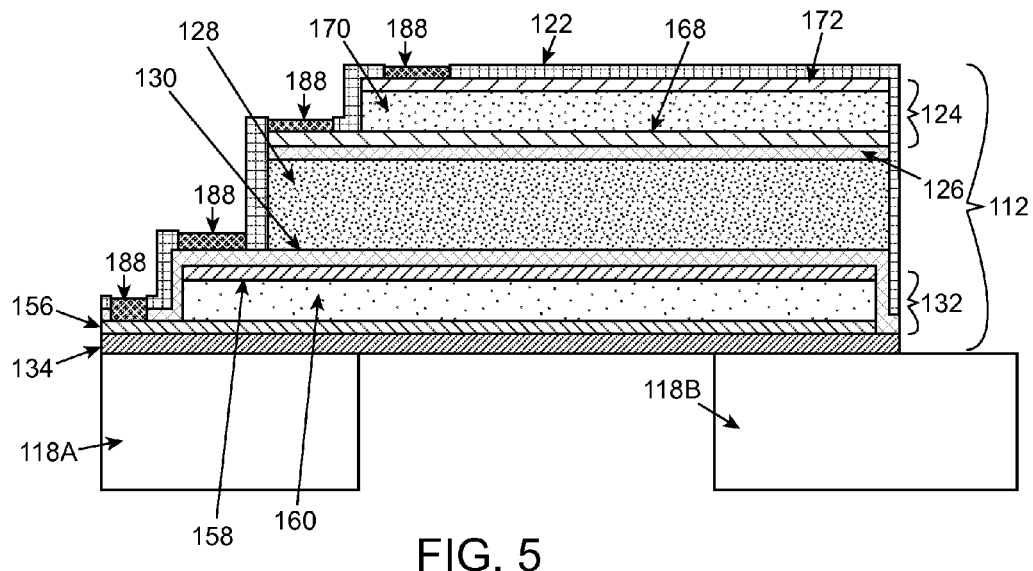
FIG. 5 is a side cross-sectional view of a fifth embodiment of a device of the present invention with an elongate resonator beam comprising a first oxide layer on a first piezoelectric stack layer over a second oxide layer on a structural layer over a third oxide layer on a second piezoelectric stack over a fourth oxide layer.

FIG. 5 illustrates a side cross-sectional view of an alternative embodiment of device 110 of the present invention. The structure of device 110 is the same as described above with respect to FIG. 4, except as described below with respect to first base portion 118A and second base portion 118B. Second base portion 118B is located at, and extends beyond, second end 116 of resonator beam 112. Resonator beam 112 is clamped, either fully or partially, to first base portion 118A and second base portion 118B.

Figure 6:
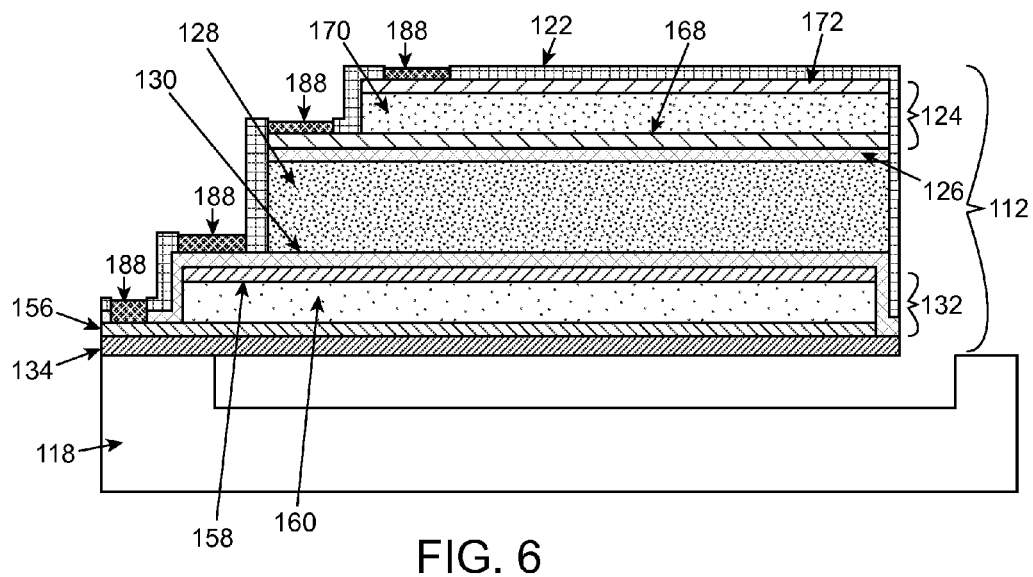
FIG. 6 is a side cross-sectional view of a sixth embodiment of a device of the present invention with an elongate resonator beam comprising a first oxide layer on a first piezoelectric stack layer over a second oxide layer on a structural layer over a third oxide layer on a second piezoelectric stack over a fourth oxide layer.

FIG. 6 illustrates a side cross-sectional view of another alternative embodiment of device 110 of the present invention. The structure of device 110 is the same as described above with respect to FIG. 4, except as described below with respect to base 118. Base 118 extends from first end 114 to second end 16 or resonator beam 12, but is spaced from elongate resonator beam 12 at second end 16.

Another aspect of the present invention relates to a system comprising an apparatus and the device of the present invention. In one embodiment, the device is electrically coupled to the apparatus. In another embodiment, the device is electrically coupled to a voltage source to act as an actuator within the apparatus.

Figure 7:
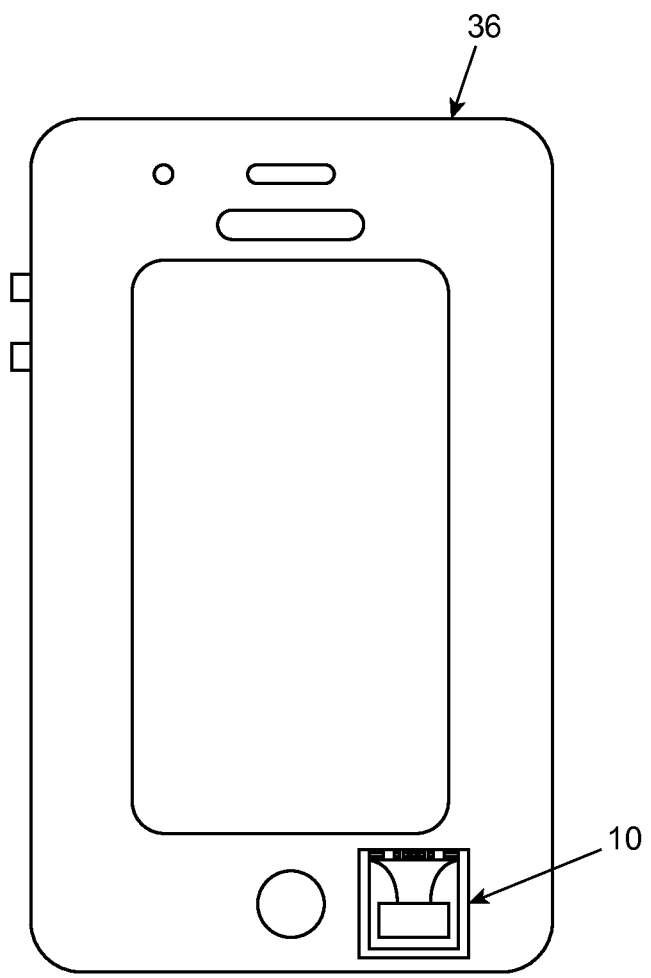
FIG. 7 illustrates one embodiment of a system of the present invention which includes a smart phone containing a device of the present invention.

Turning now to FIG. 7, apparatus (smartphone) 36 is shown to contain (within its exterior housing) device 10. According to one embodiment, device 10 serves as a sensor and detects one or more environmental conditions related to smartphone 36, such as pressure, vibration, flow rate, strain, physical motion relative to a force (i.e., gravity), impulse motion, or sound. Device 10 may further provide an output to be displayed on smartphone 36 related to the environmental condition. According to another embodiment, device 10 provides a standalone source of energy to power smartphone 36, which is used in place of or in conjunction with another standalone energy source (e.g., a battery). In another embodiment, device 10 is connected to a voltage source, such that a voltage may be applied to device 10 to cause device 10 to mechanically interact with the environment. Device 10 may integrate these various functions on a single substrate. In an alternative embodiment, the apparatus is, for example, a wearable device, such as a wrist watch-type device or necklace that electronically communicates with a tablet, PC, and/or smartphone.

Other systems of the present invention that include an apparatus and the device of the present invention are, without limitation: a laptop computer; a tablet computer; a cell phone; an e-reader; an MP3 player; a telephony headset; headphones; a router; a gaming device; a gaming controller; a mobile internet adapter; a camera; wireless sensors; wearable sensors that communicate with tablets, PCs, and/or smartphones; wireless sensor motes (for networks monitoring industrial, rail, buildings, agriculture, etc.); tire pressure sensor monitors; electronic displays (e.g., on power tools); agriculture devices for monitoring livestock; medical devices; human body monitoring devices; and toys.

The device of the present invention can be connected to such devices in substantially the same manner as shown in smart phone 36 of FIG. 7.

For example, according to one embodiment, the system of the present invention is a wireless sensor device containing a device of the present invention to monitor, e.g., any one or more various environmental properties (temperature, humidity, light, sound, vibration, wind, movement, etc.).

A further aspect of the present invention relates to a method of measuring an environmental condition. This method involves providing the system according to the present invention and subjecting the system to one or more environmental conditions that generate movement or vibrations to generate electrical energy from the first and/or second piezoelectric stack layer. The environmental condition is measured based on the electrical energy from the first and/or second piezoelectric stack layer. In addition, the system may further include circuitry in electrical connection with one or more electrodes 34, as illustrated in FIG. 1, to output and measure the electrical energy from first and/or second piezoelectric stack layers of resonator beam 12. The circuitry can be electrically coupled to an apparatus, such as smartphone 36, as shown in FIG. 7, to provide a signal generated from the piezoelectric material, which is supplied to the apparatus. In one embodiment, the measured environmental condition may be displayed on a display of the smartphone 36.

Yet another aspect of the present invention relates to a method for providing a mechanical actuation force. This method involves providing the system according to the present invention and providing a voltage source in electrical connection with the device. A voltage is applied to the device from the voltage source, wherein the applied voltage initiates motion of the elongate resonator beam. A mechanical actuation force is provided based on the motion of the elongate resonator beam. The mechanical actuation force may be utilized to operate a valve, pump, or a speaker, by way of example.

Another aspect of the present invention relates to a method of producing a symmetric dual stack microelectromechanical piezoelectric device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A structural layer is deposited over the deposited second silicon dioxide layer and patterned. A second piezoelectric stack layer is deposited over the patterned structural layer and the second piezoelectric stack layer is patterned to produce the device.

Figure 8:
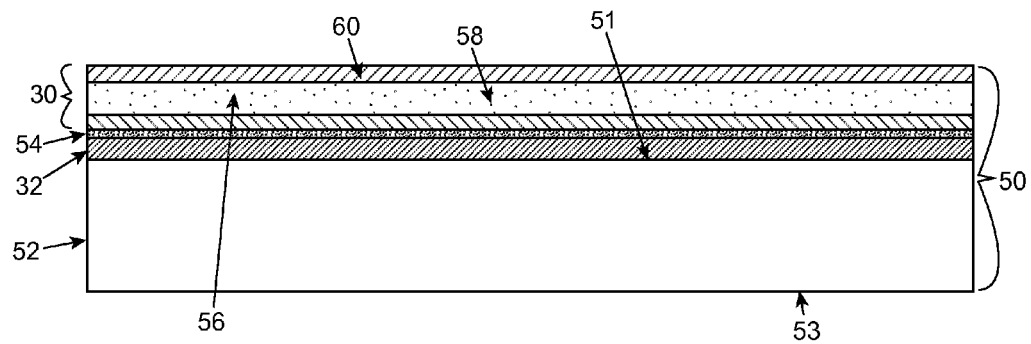
FIG. 8 is a side cross-sectional view of a layered material stack for producing a first embodiment of a device of the present invention. The layered material stack includes a silicon wafer, a first silicon dioxide layer, an optional adhesion layer, and a first piezoelectric stack layer including a first conductive material layer, a piezoelectric material layer, and a second conductive material layer.

With reference now to FIG. 8, a first embodiment of the method of producing the device of the present invention involves forming layered material stack 50, which is a stack of layered materials that is patterned to form a symmetric dual stack microelectromechanical piezoelectric device as described herein. Layered material stack 50 includes the following layered materials: silicon wafer 52 (which has first surface 51 and second surface 53), first silicon dioxide layer 32, adhesion layer 54 (which is optional and, therefore, could be present in FIGS. 9-21C but is only shown in FIG. 8), piezoelectric stack layer 30 (comprising first conductive material layer 56, piezoelectric material layer 58, and second conductive material layer 60).

As illustrated in FIG. 8, one embodiment the method of forming the device of the present invention involves forming layered material stack 50 by providing silicon wafer 52 having first surface 51 and second surface 53, depositing first silicon dioxide layer 32 (it is to be understood that the numerical designations of the layers relate to the embodiment of the device of the present invention shown in FIG. 1) on first surface 51 of silicon wafer 52, depositing optional adhesion layer 54 on first silicon dioxide layer 32, and depositing first piezoelectric stack layer 30 on adhesion layer 54 if present (and if not present on first silicon dioxide layer 32).

Silicon wafer 52 is, according to one embodiment, a single crystal double-sided polished silicon wafer. In one embodiment, silicon wafer 52 has a thickness of about 400 µm to about 1,000 µm, about 500 µm to about 900 µm, about 600 µm to about 800 µm, or about 700 µm. In one specific example, silicon wafer 52 is a double-sided polished silicon wafer having a thickness of approximately 725 µm (+/−15 µm) (i.e., the standard thickness for 200 mm wafers). Alternatively, in place of silicon wafer 52, the method of the present invention may begin with a deposited layer of silicon dioxide upon which the subsequent layers of layered material stack 50 are formed.

First silicon dioxide layer 32 is, according to one embodiment, a thermal oxide layer. In one embodiment, first silicon dioxide layer 32 has a thickness of about 0.25 jam to about 2 jam. Deposition of first silicon dioxide layer 32 onto first surface 51 of silicon wafer 52 can be carried out by methods known in the art. For example, silicon dioxide may be thermally grown and then deposited on the silicon wafer. In one particular example, one (1) µm (+/−0.05 µm) of thermally grown $SiO_2$ is deposited onto silicon wafer 52 to form silicon dioxide layer 32.

First piezoelectric stack layer 30 is deposited onto first silicon dioxide layer 32 to form a conductive material/piezoelectric material/conductive material layer. According to one embodiment, piezoelectric stack layer 30 has a thickness of about 0.5 µm to about 6 µm, or about 2 µm to about 5 µm in thickness. First piezoelectric stack layer 30 includes first conductive material layer 56, second conductive material layer 60, and piezoelectric layer 58. First conductive material layer 56 and second conductive material layer 60 may be formed of any suitable conductive materials that adequately function as an electrode. According to one embodiment, these layers are formed of the same material, such as molybdenum or platinum. However, both layers need not be formed of the same material. Piezoelectric material layer 58 is formed of any suitable piezoelectric material, as discussed above. According to one embodiment, this layer is formed from aluminum nitride (AlN).

Deposition of first piezoelectric stack layer 30 may be carried out with thin adhesion layer 54 underneath as is standard in the art. Suitable adhesion layers 54 may include materials such as titanium, AlN, Al:Cu, or Al at a layer thickness of about 0.02 µm to about 0.05 µm.

One embodiment of the method of making a device of the present invention proceeds as illustrated in FIGS. 9-21C.

Figure 9:
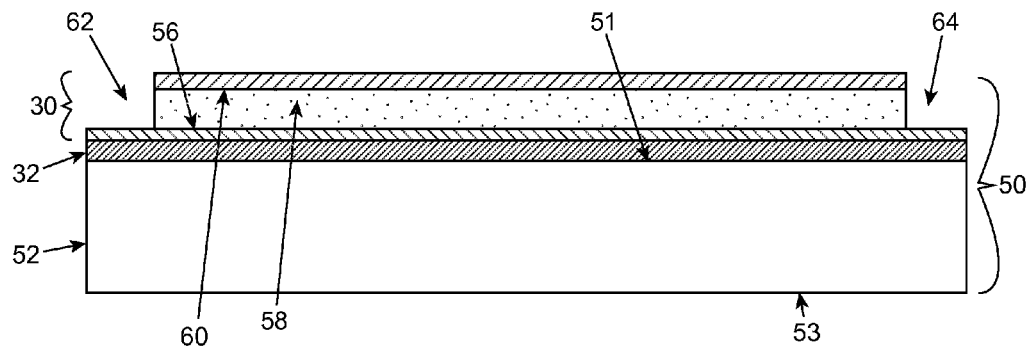
FIG. 9 is a side cross-sectional view of the layered material stack of FIG. 8 which has been patterned according to one embodiment of the method of producing a device of the present invention, to remove portions of the piezoelectric material layer and conductive material layer(s) from the stack.

First, as shown in FIG. 9, piezoelectric stack layer 30 is patterned. In particular, portions (e.g., portions 62 and 64) of piezoelectric material layer 58 and second conductive material layer 60 are removed from stack 50 to expose first conductive material layer 56. Patterning first piezoelectric stack layer 30 according to the method of the present invention may be accomplished using lithography techniques combined with wet etch with phosphoric acid for the conductive material layers and tetramethylamoniumhydroxide. Other suitable chemistries for wet or dry etching of the layers are also commonly used by persons of ordinary skill in the art and may be used in carrying out the method of the present invention.

Figure 10:
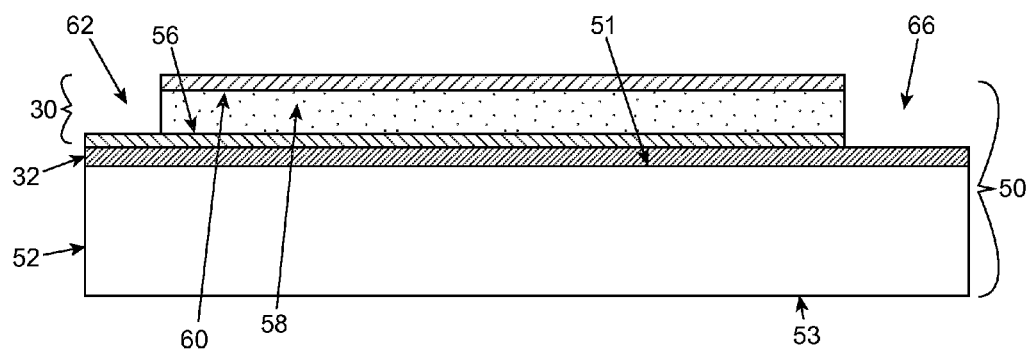
FIG. 10 is a side cross-sectional view of the layered material stack of FIG. 9, in which the first conductive material layer is patterned to remove a portion thereof from the layered material stack.

Next as shown in FIG. 10, according to one embodiment, patterning first piezoelectric stack layer 30 involves patterning first conductive material layer 56 to remove a portion thereof (e.g., portion 66) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 11:
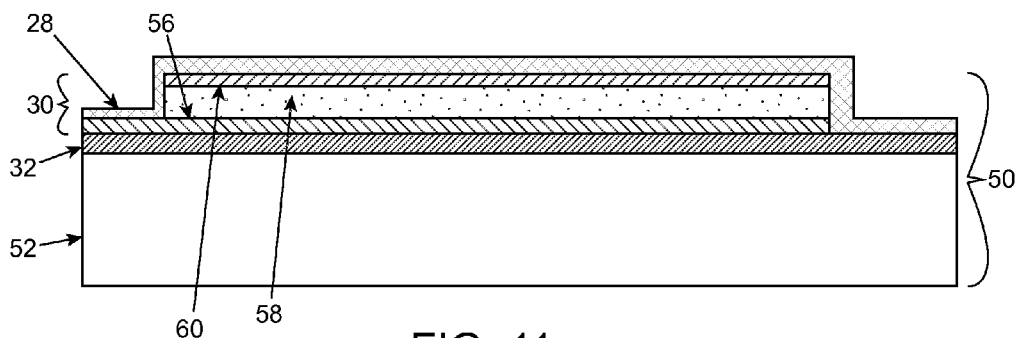
FIG. 11 is a side cross-sectional view of the layered material stack of FIG. 10, in which a second silicon dioxide layer has been deposited over the patterned piezoelectric stack layer and the first silicon dioxide layer.

Next, as shown in FIG. 11, a second silicon dioxide layer 28 is deposited over the patterned first piezoelectric stack layer 30 and the first silicon dioxide layer 32. Second silicon dioxide layer 28 is, according to one embodiment, an oxide layer. This layer provides electrical isolation of the first piezoelectric stack layer 30. According to one embodiment, this step is carried out using plasma-enhanced chemical vapor deposition of silane (a silicon source) to deposit silicon oxide for the passivation layer. This layer may be deposited to a thickness of about 1 μm.

Figure 12:
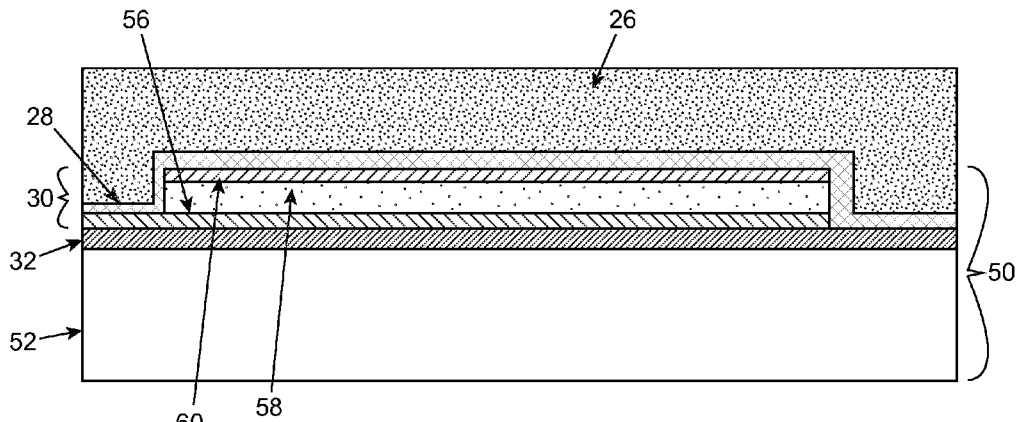
FIG. 12 is a side cross-sectional view of the layered material stack of FIG. 11, in which a structural layer has been deposited over the second silicon dioxide layer.

In the next method step illustrated in FIG. 12, structural layer 26 is deposited over the deposited second silicon dioxide layer 28. Structural layer 26 may be any suitable non-crystalline material such as silicon, polySi, metal (e.g., Cu or Ni) or other metal oxide semiconductor (CMOS) compatible material, carbon-nano-fiber (CNF), or a high temperature polymer such as polyimide. In one embodiment, structural layer 26 is deposited on second silicon dioxide layer 28 by chemical vapor deposition at a thickness range of about 10 μm to about 200 μm, about 10 μm to about 75 μm, or about 10 μm to about 50 μm. Following deposition, it may be desirable to smooth the surface of structural layer 26, e.g., by chemical mechanical polish.

Figure 13:
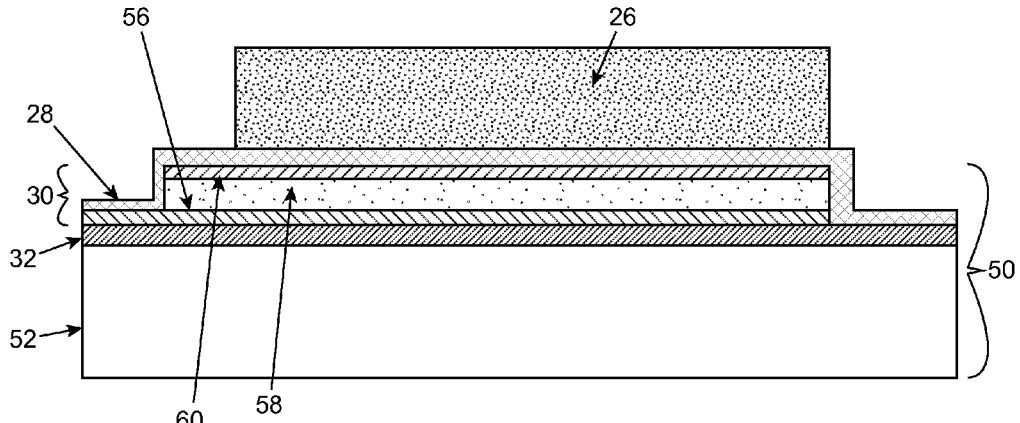
FIG. 13 is a side cross-sectional view of the layered material stack of FIG. 12, in which, according to one embodiment of the present invention, the structural layer has been patterned to remove a portion thereof from the layered material stack.

Next, structural layer 26 is patterned. This method step is illustrated in FIG. 13. According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used.

Figure 14:
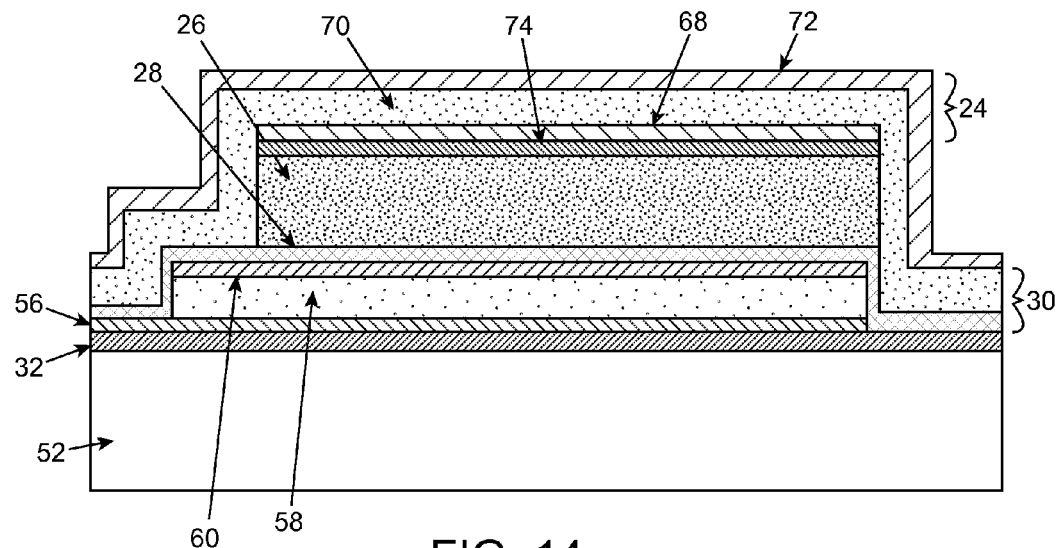
FIG. 14 is a side cross-sectional view of the layered material stack of FIG. 13, in which a second piezoelectric stack layer including a piezoelectric material layer and a conductive material layer has been deposited over the patterned structural layer, and the second silicon dioxide layer.

FIG. 14 illustrates the next method step which involves depositing second piezoelectric stack layer 24 over structural layer 26 to form a second conductive material/piezoelectric material/conductive material layer. According to one embodiment, second piezoelectric stack layer 24 has a thickness of about 0.5 μm to about 6 μm or about 2 μm to about 5 μm in thickness. According to one embodiment, second piezoelectric stack layer 24 includes optional first conductive material layer 68, piezoelectric material layer 70, and second conductive material layer 72. In another embodiment, second piezoelectric stack layer 24 includes second conductive material layer 72 over the piezoelectric material layer 70 which is on the patterned structural layer 26. In this configuration, structural layer 26 is useful as an electrode.

First conductive material layer 68 (when present) and second conductive material layer 72 may be formed of any suitable conductive materials that adequately function as an electrode. According to one embodiment, these layers are formed of the same material, such as molybdenum or platinum. However, both layers need not be formed of the same material. Piezoelectric material layer 70 is formed of any suitable piezoelectric material, as discussed above. According to one embodiment, this layer is formed of aluminum nitride (AlN).

Deposition of second piezoelectric stack layer 24 may be carried out with thin adhesion layer 74 underneath as is standard in the art. Suitable adhesion layers 74 may include materials such as titanium, AlN, Al:Cu, or Al at a layer thickness of about 0.02 μm to about 0.05 μm.

Figure 15:
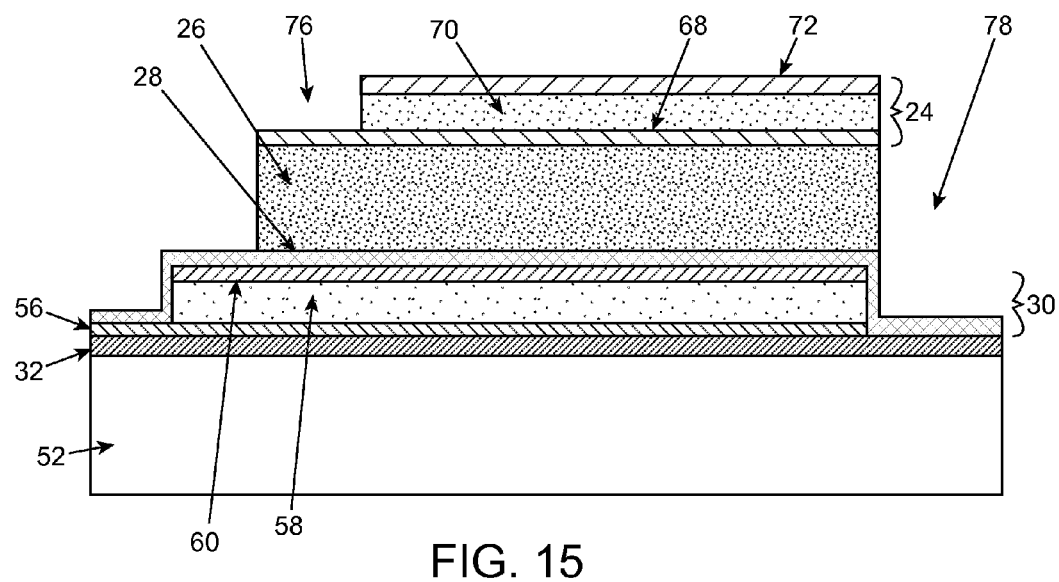
FIG. 15 is a side cross-sectional view of the layered material stack of FIG. 14, in which the second piezoelectric stack layer has been patterned to remove a portion of the second piezoelectric stack layer from the layered material stack.

Next, as shown in FIG. 15, second piezoelectric stack layer 24 is patterned. In particular, portions (e.g., portions 76 and 78) of piezoelectric material layer 70 and second conductive material layer 72 are removed from the second piezoelectric stack layer 24 to expose first conductive material layer 68 (if present) or structural layer 26.

Patterning second piezoelectric stack layer 24 according to the method of the present invention may be accomplished using lithography techniques combined with wet etch with phosphoric acid for the conductive material layers and tetramethylamoniumhydroxide. Other suitable chemistries for wet or dry etching of the layers are also commonly used by persons of ordinary skill in the art and may be used in carrying out the method of the present invention.

According to one embodiment, the method of the present invention may further involve applying a passivation layer to the second patterned piezoelectric stack layer, the patterned structural layer, and the first patterned piezoelectric stack layer and patterning the passivation layer, prior to etching the second side surface of the silicon wafer. According to another embodiment, the method of the present invention may further involve depositing a metal bondpad layer on the patterned passivation layer prior to etching the surface of the silicon wafer.

In another embodiment, the patterning of the structural layer 26, which is shown in FIG. 13, is performed after deposition and patterning of second piezoelectric stack layer 24, which is shown in FIGS. 14 and 15.

Figure 16:
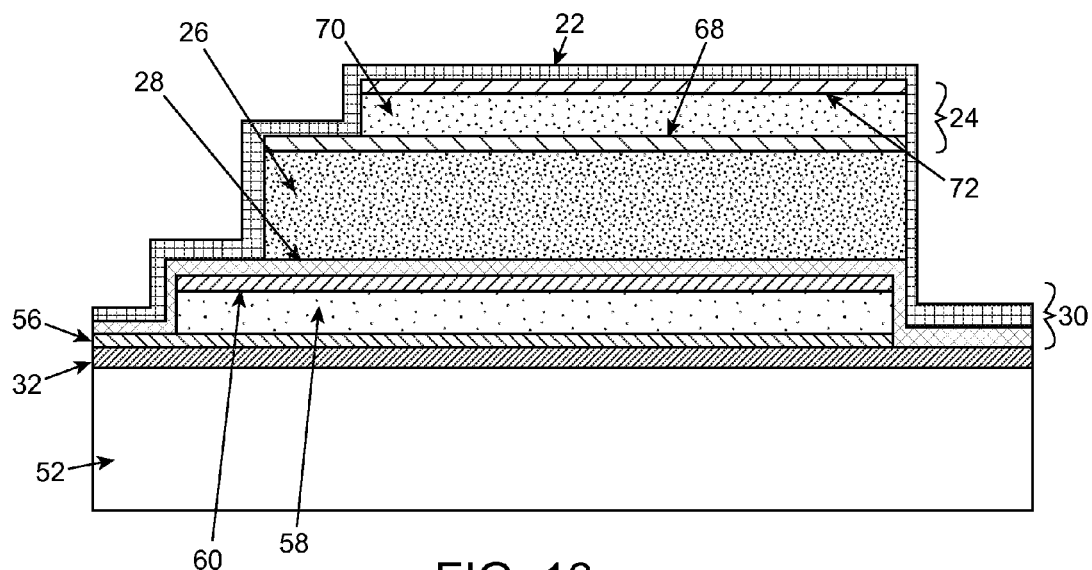
FIG. 16 is a side cross-sectional view of the layered material stack of FIG. 15, in which a third silicon dioxide layer has been deposited over the patterned second piezoelectric stack layer, the patterned structural layer, and the second silicon dioxide layer.

In the next method step, as shown in FIG. 16, third silicon dioxide layer 22 is deposited over patterned second piezoelectric stack layer 24, patterned structural layer 26, and second silicon dioxide layer 28. According to one embodiment, this step is carried out using plasma-enhanced chemical vapor deposition of silane (a silicon source) to deposit silicon oxide for the passivation layer. This layer may be deposited to a thickness of about 1 μm. According to another embodiment, depositing the third silicon dioxide layer is an optional step that provides robustness to the structure against abrasion.

Figure 17:
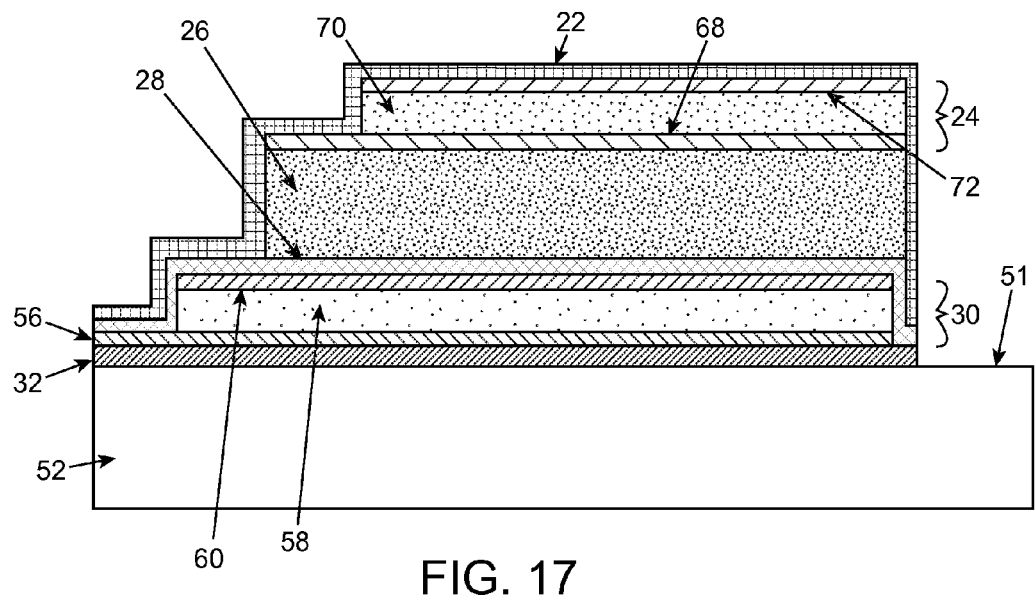
FIG. 17 is a side cross-sectional view of the layered material stack of FIG. 16 which has been patterned to remove portions of the third silicon dioxide layer, the second silicon dioxide layer, and the first silicon dioxide layer.

In the method step shown in FIG. 17, first, second, and third silicon dioxide layers 32, 28, and 22 are patterned so that the structural layer 26 will be released after backside etch. According to one embodiment, this step involves removing a portion of the first, second, and third silicon dioxide layers 32, 28, and 22 to expose the first surface 51 of the silicon wafer 52. According to one embodiment, this patterning is carried out using the $CHF_3$ reactive ion etch process.

Figure 18:
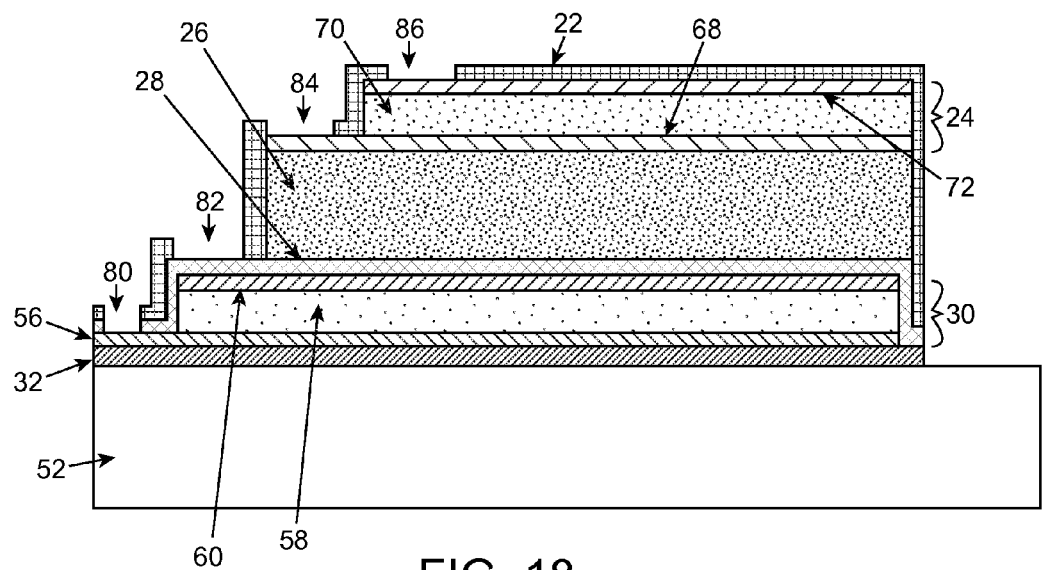
FIG. 18 is a side cross-sectional view of the layered material stack of FIG. 17 which has been patterned to remove a portion of the third silicon dioxide layer to leave a portion of the second piezoelectric stack layer, a portion of the first piezoelectric stack layer, and a portion of the second silicon dioxide layer exposed.

Next, as shown in FIG. 18, third silicon dioxide layer 22 is patterned. According to one embodiment, this step involves removing a portion of third silicon dioxide layer 22 to leave portions 80 and 82 of first piezoelectric stack layer 30, and portions 84 and 86 of second piezoelectric layer 24, exposed. According to one embodiment, this patterning is carried out using the $CHF_3$ reactive ion etch process. In one embodiment, the patterning illustrated in FIGS. 17 and 18 is performed in a single step.

Figure 19:
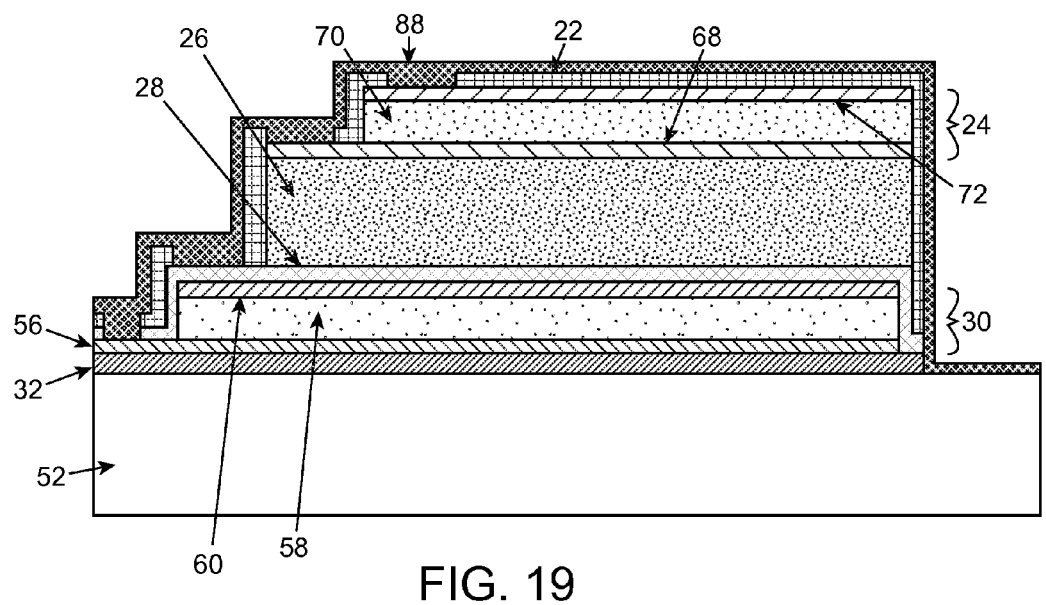
FIG. 19 is a side cross-sectional view of the layered material stack of FIG. 18, in which a metal bondpad layer has been deposited over the patterned third silicon dioxide layer, and portions of the patterned second piezoelectric stack layer, the patterned structural layer, and the patterned first piezoelectric stack layer.

A further (optional) method step is illustrated in FIG. 19, which illustrates metal bondpad layer 88 deposited over the patterned third silicon dioxide layer 22, as well as portions 80 and 82 of first piezoelectric stack layer 30, and portion 84 and 86 of second piezoelectric stack layer 24. Bondpad layer 88 provides a surface that allows for a robust wire bond to be formed to the device, ensuring good electrical connection. According to one embodiment, metal bondpad layer 88 is deposited to a thickness of about 1 μm, and is a metal material (e.g., Al). This layer is deposited to improve reliability of the wire bond.

Figure 20:
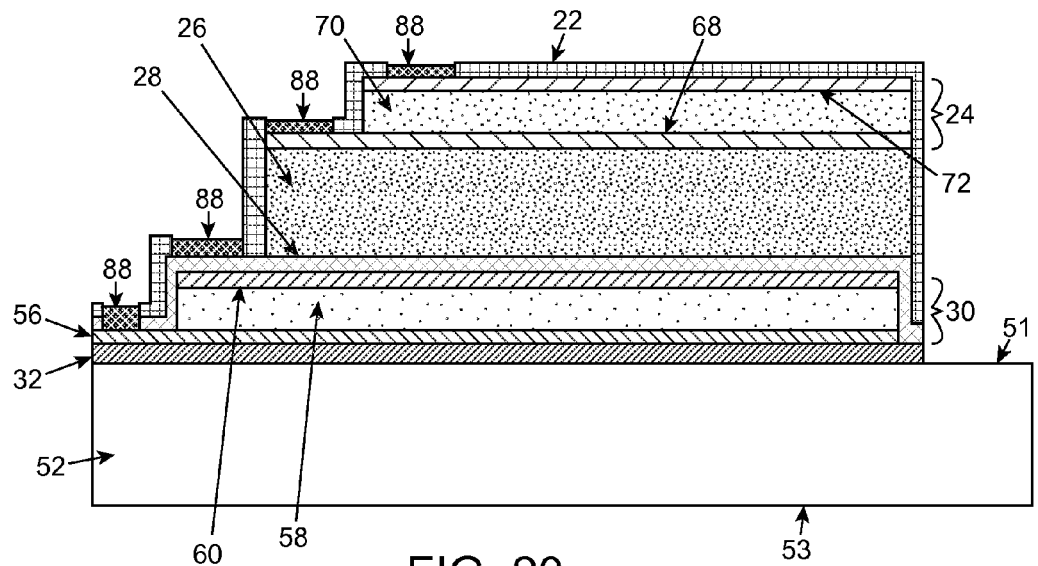
FIG. 20 is a side cross-sectional view of the layered material stack of FIG. 19 which has been patterned to remove portions of the metal bondpad layer.

FIG. 20 illustrates the next method step which involves patterning metal bondpad layer 88 when present. According to one embodiment, metal bondpad layer 88 is patterned slightly longer than openings for top and bottom electrode connections. In one embodiment, patterning of metal bondpad layer 88 is carried out using wet etch chemistry based on phosphoric acid. However, other methods may also be used.

Figure 21A:
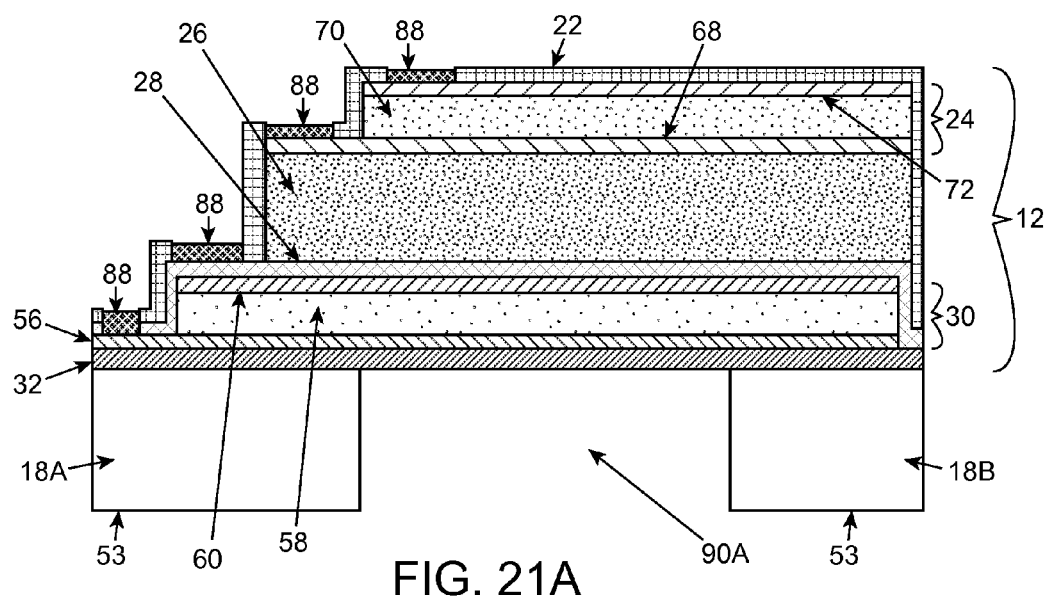
FIGS. 21A-21C are side cross-sectional views of the layered material stack of FIG. 20, in which portions of the of the silicon wafer have been etched to create a resonator beam and one or more base portions, thus creating one embodiment of the device of the present invention, which has dual piezoelectric stacks.
Figure 21B:
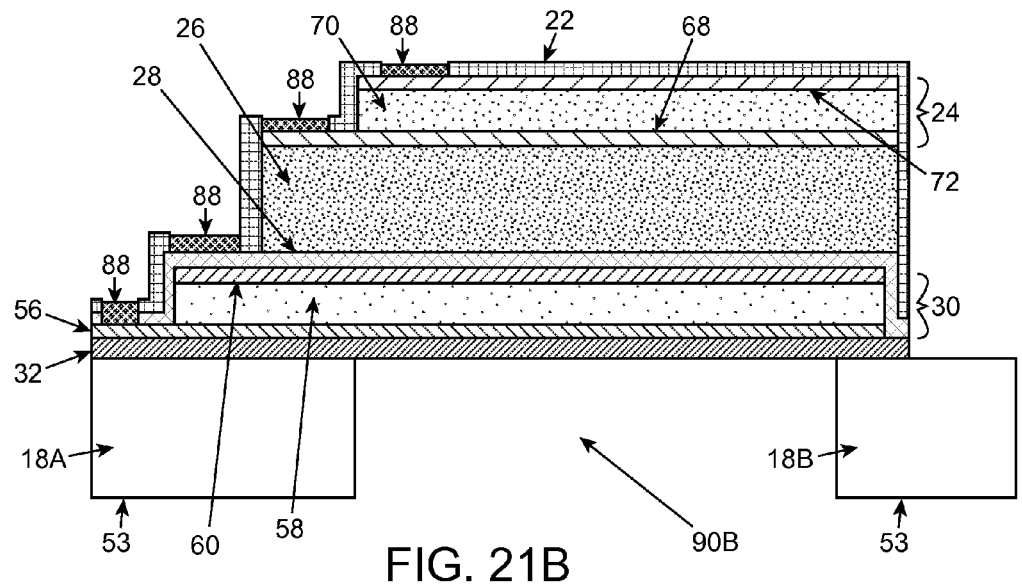
Figure 21C:
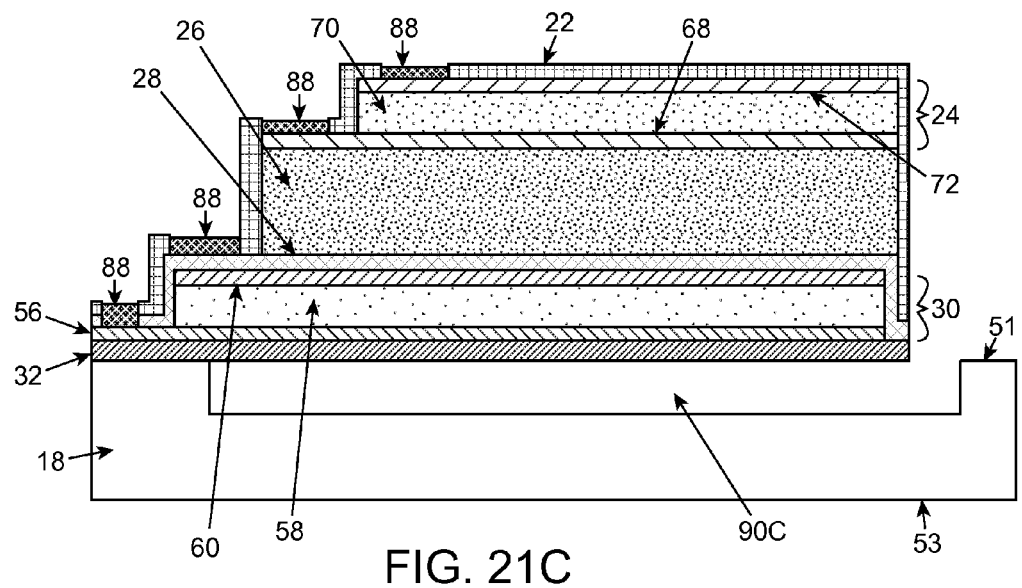

Next, in the method step illustrated in FIGS. 21A-21C, silicon wafer 52 is optionally etched to produce different embodiments of the device. In one embodiment, as shown in FIG. 21A, silicon wafer 52 is etched at surface 53 to create resonator beam 12, first base portion 18A, and second base portion 18B, thus producing one embodiment of the device of the present invention. In other words, portions of silicon wafer 52 are etched away to create a cavity 90A beneath what has become resonator beam 12 to create the separation between the portion of silicon wafer 52 that has become first base portion 18A and the portion of silicon wafer 52 that has become second base portion 18B. According to one embodiment, etching silicon wafer 52 is carried out using lithography techniques and deep reactive ion etch with $SF_6/C_4F_8$ chemistry.

In another embodiment, as shown in FIG. 21B, silicon wafer 52 is etched at surface 53 to create resonator beam 12, first base portion 18A, and second base portion 18B, thus producing one embodiment of the device of the present invention. In other words, portions of silicon wafer 52 are etched away to create a cavity 90B beneath what has become resonator beam 12 to create the separation between the portion of silicon wafer 52 that has become first base portion 18A and the portion of silicon wafer 52 that has become second base portion 18B. Second base portion 18B extends beyond second end 16 of resonator beam 12. According to one embodiment, etching silicon wafer 52 is carried out using lithography techniques and deep reactive ion etch with $SF_6/C_4F_8$ chemistry.

In yet another embodiment, as shown in FIG. 21C, silicon wafer 52 is etched at surface 51 to create resonator beam 12 and base 18, thus producing one embodiment of the device of the present invention. In other words, portions of silicon wafer 52 are etched away to create a cavity 90C beneath what has become resonator beam 12 to create the separation between the portion of silicon wafer 52 that has become base 18 and second end 16 of resonator beam 12. Base 18 extends from first end 14 to second end 16 of resonator beam 12, but is spaced from elongate resonator beam 12 at second end 16. According to one embodiment, etching silicon wafer 52 is carried out using a dry etch such as xenon fluoride or a wet etch such as KOH.

A further aspect of the present invention relates to a method of producing a device. This method involves providing a silicon wafer having a first and second surface. A first silicon dioxide layer is deposited on the first surface of the silicon wafer. A first piezoelectric stack layer is deposited on the first silicon dioxide layer and patterned. A second silicon dioxide layer is deposited over the patterned first piezoelectric stack layer. A structural layer is deposited over the deposited second silicon dioxide layer. A third silicon dioxide layer is deposited over the deposited structural layer. A second piezoelectric stack layer is deposited over the structural layer and patterned. The third silicon dioxide layer and the structural layer are patterned. The silicon wafer is etched to produce the device.

Figure 22:
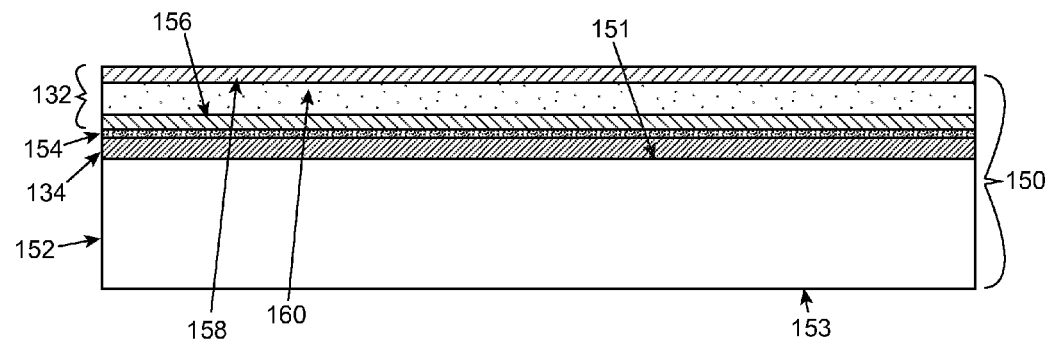
FIG. 22 is a side cross-sectional view of a layered material stack for producing a second embodiment of a device of the present invention. The layered material stack includes a silicon wafer, a first silicon dioxide layer, and a first piezoelectric stack layer including a first conductive material layer, a piezoelectric material layer, and a second conductive material layer.

With reference now to FIG. 22, another embodiment of the method of producing a device of the present invention involves forming layered material stack 150, which is a stack of layered materials that is patterned to form a symmetric dual stack microelectromechanical piezoelectric device as described herein. Layered material stack 150 includes the following layered materials: silicon wafer 152 (which has first surface 151 and second surface 153), first silicon dioxide layer 134, adhesion layer 154 (which is optional and, therefore, could be present in FIGS. 23-37C but is only shown in FIG. 22), piezoelectric stack layer 132 (comprising first conductive material layer 156, second conductive material layer 158, and piezoelectric material layer 160).

As illustrated in FIG. 22, another embodiment of the method of forming the device of the present invention involves forming layered material stack 150 by providing silicon wafer 152 (as described above) having first surface 151 and second surface 153, depositing first silicon dioxide layer 134 (it is to be understood that the numerical designations of the layers relate to the embodiment of the device of the present invention shown in FIG. 4) on first surface 151 of silicon wafer 152, depositing optional adhesion layer 154 on first silicon dioxide layer 134, and depositing first piezoelectric stack layer 132 adhesion layer 154 if present (and if not present on first silicon dioxide layer 134).

First silicon dioxide layer 134 is, according to one embodiment, a thermal oxide layer. In one embodiment, first silicon dioxide layer 134 has a thickness of about 0.25 μm to about 2 μm. Deposition of first silicon dioxide layer 134 onto first surface 51 of silicon wafer 52 can be carried out by methods known in the art. For example, silicon dioxide may be thermally grown and then deposited on the silicon wafer. In one particular example, one (1) μm (+/−0.05 μm) of thermally grown $SiO_2$ is deposited onto silicon wafer 52 to form silicon dioxide layer 134.

First piezoelectric stack layer 132 is deposited onto first silicon dioxide layer 134 to form a conductive material/piezoelectric material/conductive material layer. According to one embodiment, piezoelectric stack layer 134 has a thickness of about 0.5 μm to about 6 μm, or about 2 μm to about 5 μm in thickness. First piezoelectric stack layer 132 includes first conductive material layer 156, second conductive material layer 158, and piezoelectric layer 160. First conductive material layer 156 and second conductive material layer 158 may be formed of any suitable conductive materials that adequately function as an electrode. According to one embodiment, these layers are formed of the same material, such as molybdenum or platinum. However, both layers need not be formed of the same material. Piezoelectric material layer 160 is formed of any suitable piezoelectric material, as discussed above. According to one embodiment, this layer is formed of aluminum nitride (AlN).

Deposition of first piezoelectric stack layer 132 may be carried out with thin adhesion layer 154 underneath as is standard in the art. Suitable adhesion layers 154 may include materials such as titanium, AlN, Al:Cu, or Al at a layer thickness of about 0.02 μm to about 0.05 μm.

Figure 23:
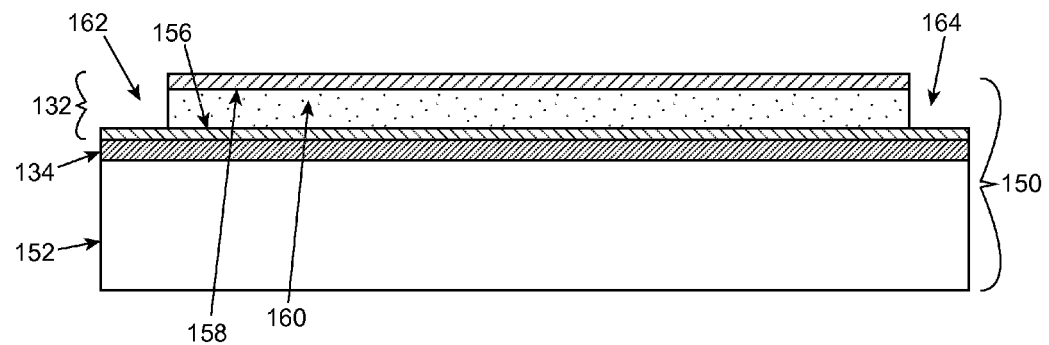
FIG. 23 is a side cross-sectional view of the layered material stack of FIG. 22 which has been patterned, according to one embodiment of the method of producing a device of the present invention, to remove portions of the piezoelectric material layer and conductive material layer(s) from the stack.

One embodiment of the method of making a device of the present invention proceeds as illustrated in FIGS. 23-37C. First, as shown in FIG. 23, piezoelectric stack layer 132 is patterned. In particular, portions (e.g., portions 162 and 164)

of piezoelectric material layer 160 and second conductive material layer 158 are removed from stack 50 to expose first conductive material layer 156. Patterning first piezoelectric stack layer 132 according to the method of the present invention may be accomplished using lithography techniques combined with wet etch with phosphoric acid for the conductive material layers and tetramethylamoniumhydroxide. Other suitable chemistries for wet or dry etching of the layers are also commonly used by persons of ordinary skill in the art and may be used in carrying out the method of the present invention.

Figure 24:
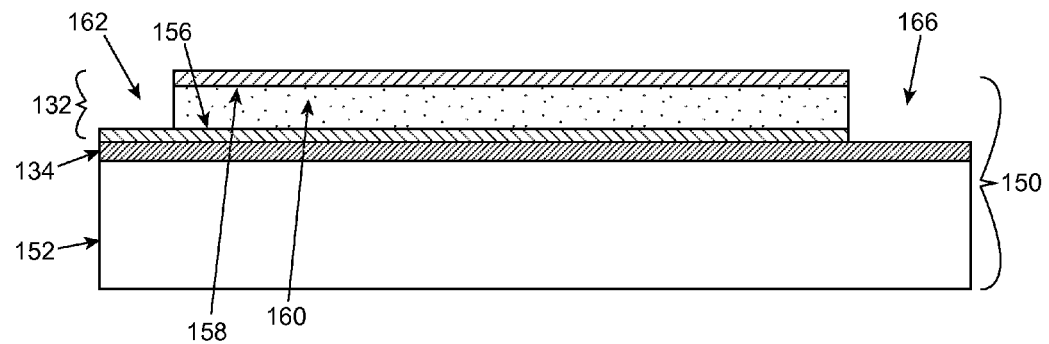
FIG. 24 is a side cross-sectional view of the layered material stack of FIG. 23, in which the first conductive material layer is patterned to remove a portion thereof from the layered material stack.

Next, as shown in FIG. 24, according to one embodiment, patterning first piezoelectric stack layer 132 involves patterning first conductive material layer 156 to remove a portion thereof (e.g., portion 166) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 25:
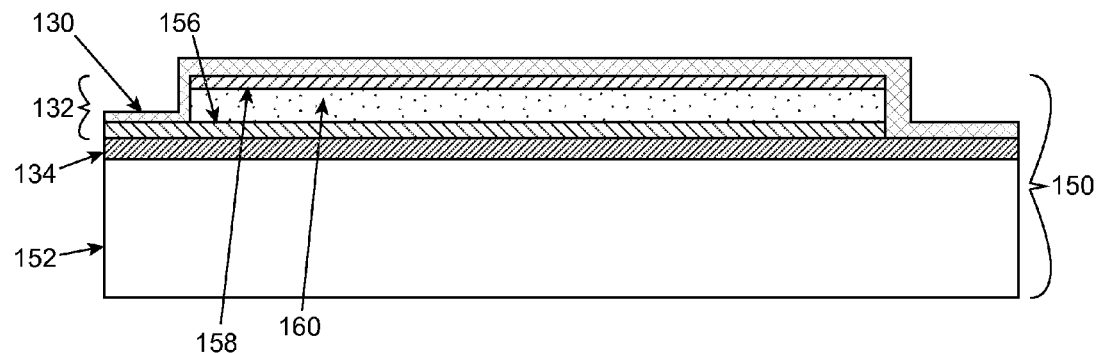
FIG. 25 is a side cross-sectional view of the layered material stack of FIG. 24, in which a second silicon dioxide layer has been deposited over the patterned piezoelectric stack layer and the first silicon dioxide layer.

Next, as shown in FIG. 25, a second silicon dioxide layer 130 is deposited over the patterned first piezoelectric stack layer 132 and the first silicon dioxide layer 134. Second silicon dioxide layer 130 is, according to one embodiment, a high temperature oxide layer. This layer provides electrical isolation of the first piezoelectric stack layer 132. According to one embodiment, this step is carried out using plasma-enhanced chemical vapor deposition of silane (a silicon source) to deposit silicon oxide for the passivation layer. This layer may be deposited to a thickness of about 1 μm.

Figure 26:
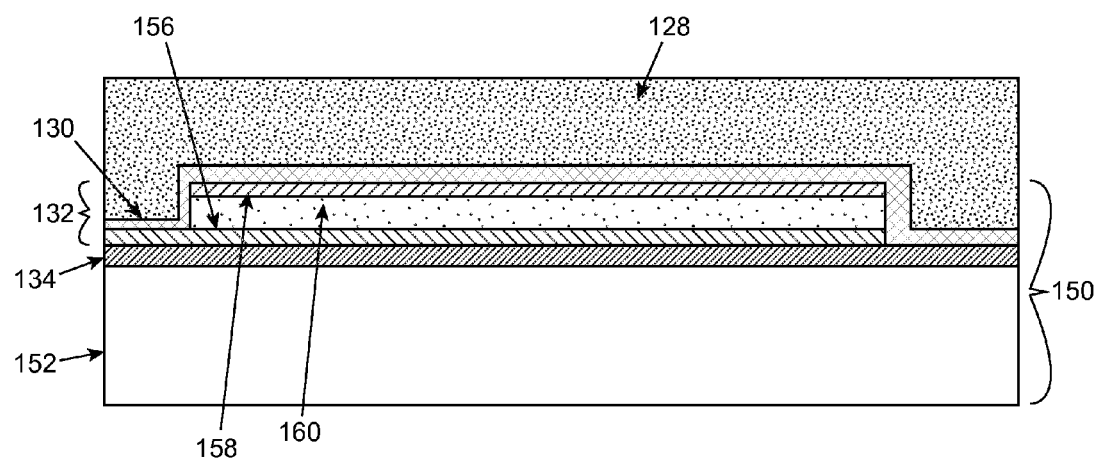
FIG. 26 is a side cross-sectional view of the layered material stack of FIG. 25, in which a structural layer has been deposited over the second silicon dioxide layer.

In the next method step illustrated in FIG. 26, structural layer 128 is deposited over the deposited second silicon dioxide layer 130. Structural layer 128 may be any suitable non-crystalline material such as silicon, polySi, metal (e.g., Cu or Ni) or other metal oxide semiconductor (CMOS) compatible material, carbon-nano-fiber (CNF), or a high temperature polymer such as polyimide. In one embodiment, structural layer 128 is deposited on second silicon dioxide layer 130 by chemical vapor deposition at a thickness range of about 10 μm to about 200 μm, about 10 μm to about 75 μm, or about 10 μm to about 50 μm. Following deposition, it may be desirable to smooth the surface of structural layer 128, e.g., by chemical mechanical polish.

Figure 27:
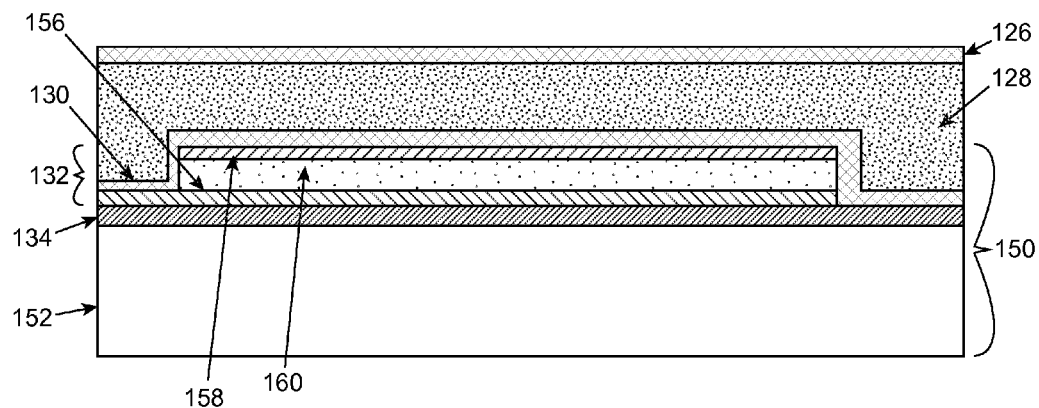
FIG. 27 is a side cross-sectional view of the layered material stack of FIG. 26, in which a third silicon dioxide layer has been deposited over the structural layer.

Next, as shown in FIG. 27, third silicon dioxide layer 126 is deposited over structural layer 128. Third silicon dioxide layer 126 is, according to one embodiment, a high temperature oxide layer. According to one embodiment, this step is carried out using plasma-enhanced chemical vapor deposition of silane (a silicon source) to deposit silicon oxide for the passivation layer. This layer may be deposited to a thickness of about 1 μm.

Figure 28:
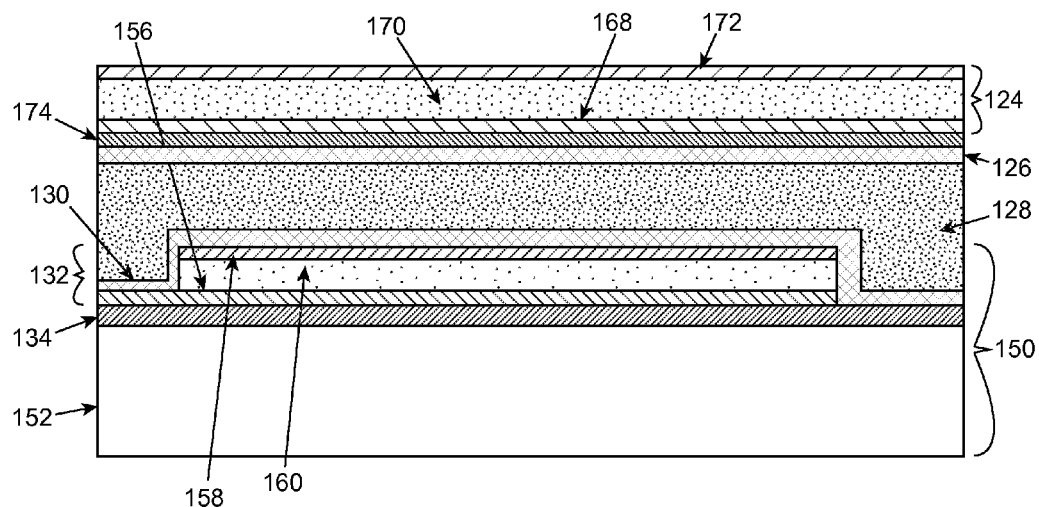
FIG. 28 is a side cross-sectional view of the layered material stack of FIG. 27, in which a second piezoelectric stack layer, including a first conductive material layer, a piezoelectric material layer, and a second conductive material layer, has been deposited over the structural layer and the second silicon dioxide layer.

FIG. 28 illustrates the next method step, which involves depositing second piezoelectric stack layer 124 over third silicon dioxide layer 126 to form a second conductive material/piezoelectric material/conductive material layer. According to one embodiment, second piezoelectric stack layer 124 has a thickness of about 0.5 μm to about 6 μm, or about 2 μm to about 5 μm in thickness. According to one embodiment, second piezoelectric stack layer 124 includes first conductive material layer 168, piezoelectric material layer 170, and second conductive material layer 172.

First conductive material layer 168 and second conductive material layer 172 may be formed of any suitable conductive materials that adequately function as an electrode. According to one embodiment, these layers are formed of the same material, such as molybdenum or platinum. However, both layers need not be formed of the same material. Piezoelectric material layer 170 is formed of any suitable piezoelectric material, as discussed above. According to one embodiment, this layer is formed of aluminum nitride (AlN).

Deposition of second piezoelectric stack layer 124 may be carried out with thin adhesion layer 174 underneath as is standard in the art. Suitable adhesion layers 174 may include materials such as titanium, AlN, Al:Cu, or Al at a layer thickness of about 0.02 μm to about 0.05 μm.

Figure 29:
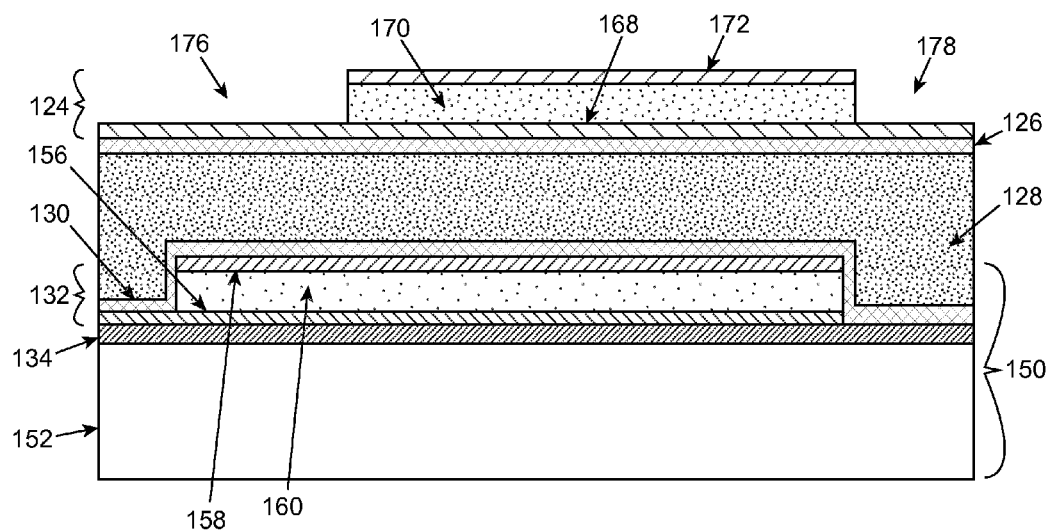
FIG. 29 is a side cross-sectional view of the layered material stack of FIG. 28, in which the second piezoelectric stack layer has been patterned to remove portions of the piezoelectric material layer and conductive material layer(s) from the second piezoelectric stack layer.

Next, as shown in FIG. 29, second piezoelectric stack layer 124 is patterned. In particular, portions (e.g., portions 176 and 178) of piezoelectric material layer 170 and second conductive material layer 172 are removed from the second piezoelectric stack layer 124 to expose first conductive material layer 168. Patterning second piezoelectric stack layer 124 according to the method of the present invention may be accomplished using lithography techniques combined with wet etch with phosphoric acid for the conductive material layers and tetramethylamoniumhydroxide. Other suitable chemistries for wet or dry etching of the layers are also commonly used by persons of ordinary skill in the art and may be used in carrying out the method of the present invention.

Figure 30:
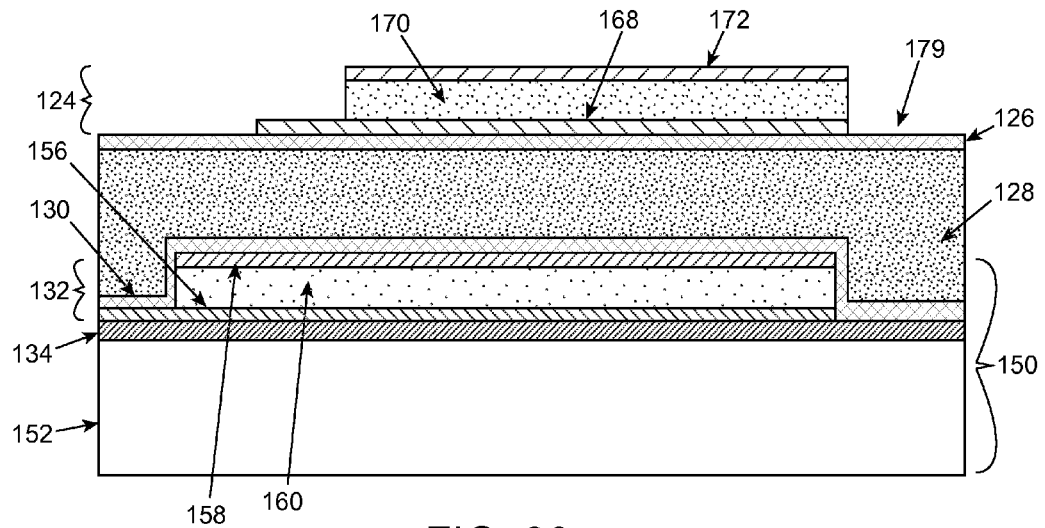
FIG. 30 is a side cross-sectional view of the layered material stack of FIG. 29, in which the first conductive material layer is patterned to remove a portion thereof from the second piezoelectric stack layer of the layered material stack.

Next, as shown in FIG. 30, according to one embodiment, patterning second piezoelectric stack layer 124 involves patterning first conductive material layer 168 to remove a portion thereof (e.g., portion 179) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 31:
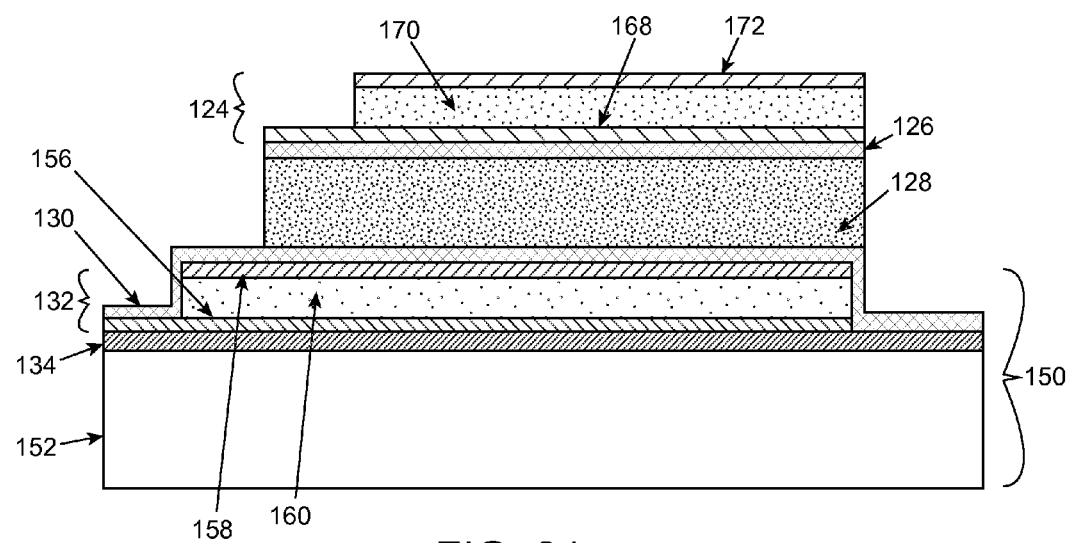
FIG. 31 is a side cross-sectional view of the layered material stack of FIG. 30, in which the third silicon dioxide layer and the structural layer have been patterned to remove portions thereof from the layered material stack.

Next, structural layer 128 and third silicon dioxide layer 126 are patterned. This method step is illustrated in FIG. 31. According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used.

According to one embodiment, the method of the present invention may further involve applying a passivation layer to the second patterned piezoelectric stack layer, the patterned structural layer, and the first patterned piezoelectric stack layer and patterning the passivation layer, prior to etching the silicon wafer. According to another embodiment, the method of the present invention may further involve depositing a metal bondpad layer on the patterned passivation layer prior to etching the silicon wafer.

In another embodiment, the patterning of structural layer 128, which is shown in FIG. 31, is performed prior to deposition and patterning of second piezoelectric stack layer 124, which is shown in FIGS. 28-30.

Figure 32:
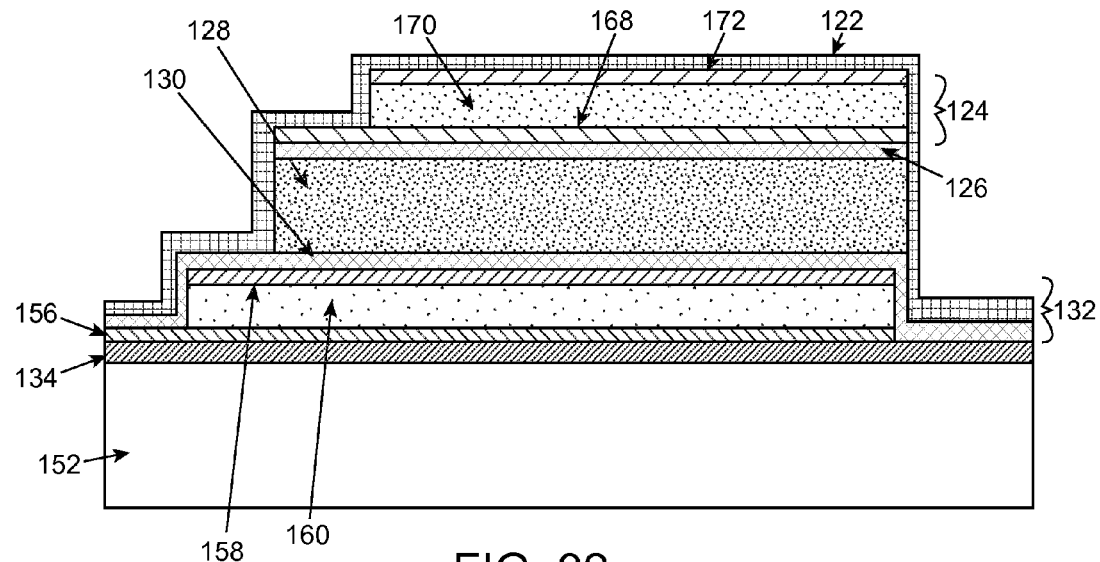
FIG. 32 is a side cross-sectional view of the layered material stack of FIG. 31, in which a fourth silicon dioxide layer has been deposited over the patterned second piezoelectric stack layer and the second silicon dioxide layer.

In the next method step, as shown in FIG. 32, a fourth silicon dioxide layer 122 is deposited over the patterned second piezoelectric stack layer 124 and the second silicon dioxide layer 130. According to one embodiment, this step is carried out using plasma-enhanced chemical vapor deposition of silane (a silicon source) to deposit silicon oxide for the passivation layer. This layer may be deposited to a thickness of about 1 μm. According to another embodiment, depositing the third silicon dioxide layer is an optional step that provides robustness to the structure against abrasion.

Figure 33:
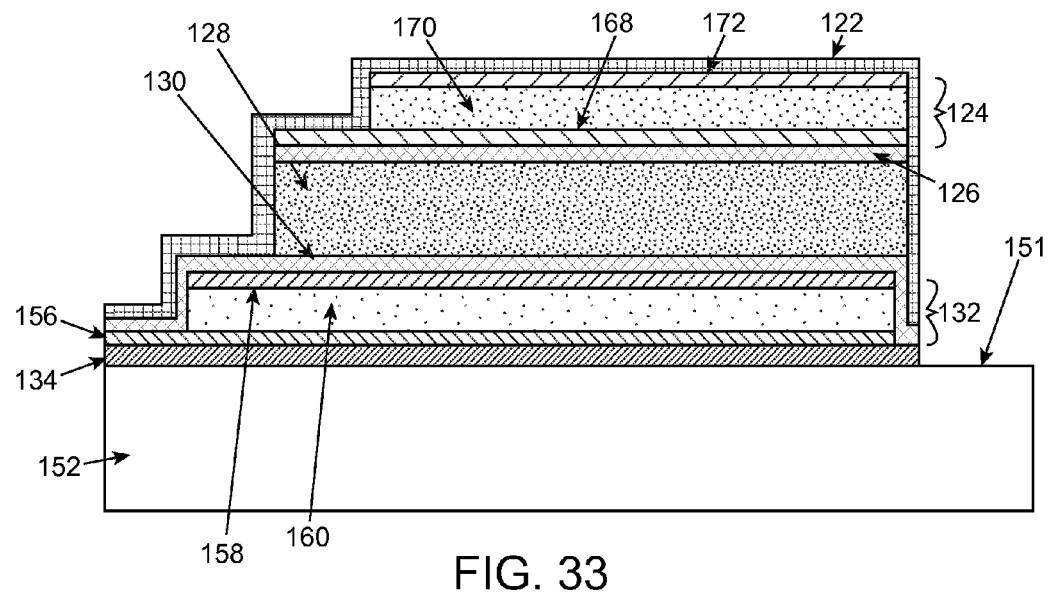
FIG. 33 is a side cross-sectional view of the layered material stack of FIG. 32 which has been patterned to remove portions of the fourth silicon dioxide layer, the second silicon dioxide layer, and the first silicon dioxide layer.

In the method step shown in FIG. 33, first, second, and fourth silicon dioxide layers 134, 130, and 122 are patterned so that the structural layer 128 will be released after backside etch. According to one embodiment, this step involves removing a portion of the first, second, and fourth silicon dioxide layers 134, 130, and 122 to expose the first surface 151 of the silicon wafer 152. According to one embodiment, this patterning is carried out using the $CHF_3$ reactive ion etch process.

Figure 34:
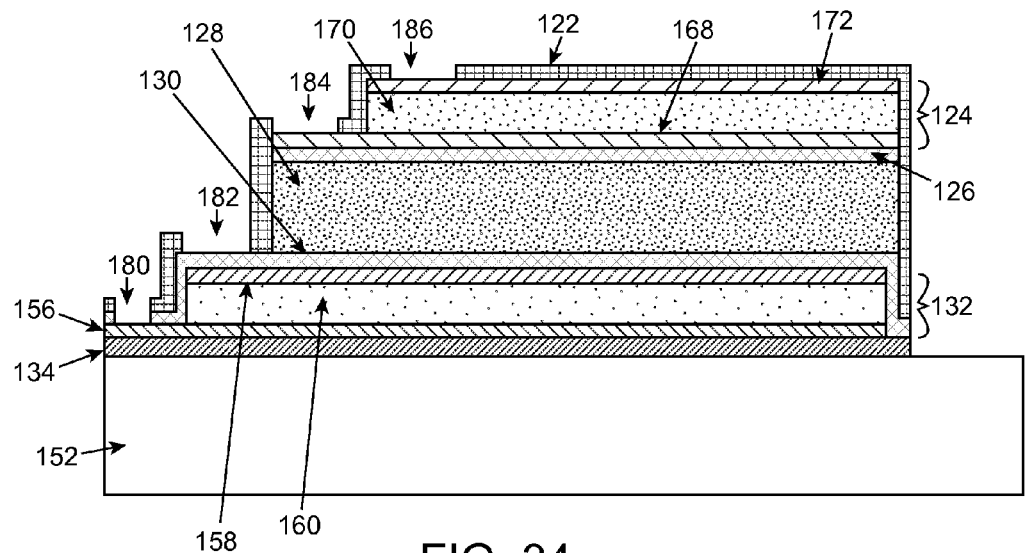
FIG. 34 is a side cross-sectional view of the layered material stack of FIG. 33 which has been patterned to remove a portion of the fourth silicon dioxide layer to leave a portion of the second piezoelectric stack layer, a portion of the second silicon dioxide layer, and a portion of the first piezoelectric stack layer exposed.

Next, as shown in FIG. 34, fourth silicon dioxide layer 122 is patterned. According to one embodiment, this step involves removing a portion of fourth silicon dioxide layer 122 to leave portions 180 and 182 of first piezoelectric stack layer 132 and portions 184 and 186 of second piezoelectric layer 124 exposed. According to one embodiment, this patterning is carried out using the $CHF_3$ reactive ion etch process. In one embodiment, the patterning illustrated in FIGS. 33 and 34 is performed in a single step.

Figure 35:
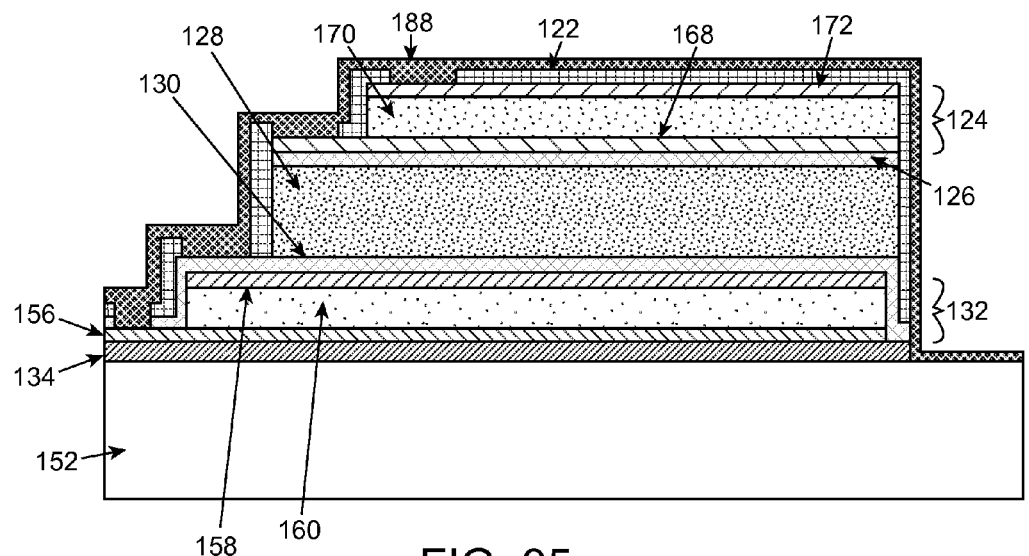
FIG. 35 is a side cross-sectional view of the layered material stack of FIG. 34, in which a metal bondpad layer has been deposited over the patterned fourth silicon dioxide layer and portions of the patterned second piezoelectric stack layer, the patterned second silicon dioxide layer, and the patterned first piezoelectric stack layer.

A further (optional) method step is illustrated in FIG. 35, which illustrates metal bondpad layer 188 deposited over the patterned fourth silicon dioxide layer 122, as well as portions 180 and 182 of first piezoelectric stack layer 132, and portions 184 and 186 of second piezoelectric stack layer 124. Bondpad layer 188 provides a surface that allows for a robust wire bond to be formed to the device, ensuring good electrical connection. According to one embodiment, metal bondpad layer 188 is deposited to a thickness of about 1 μm, and is a metal material (e.g., Al). This layer is deposited to improve reliability of the wire bond.

Figure 36:
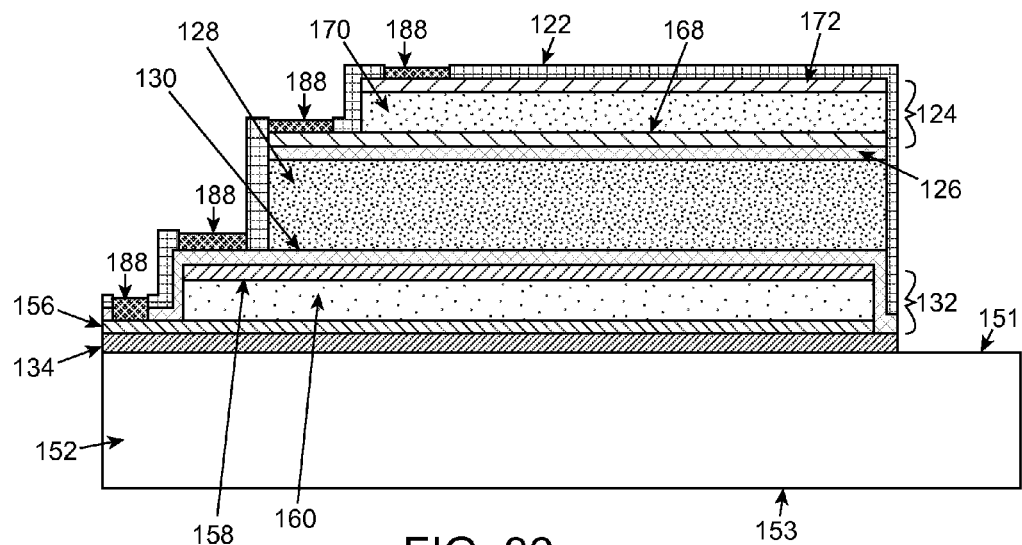
FIG. 36 is a side cross-sectional view of the layered material stack of FIG. 35 which has been patterned to remove portions of the metal bondpad layer.

FIG. 36 illustrates the next method step, which involves patterning metal bondpad layer 188 when present. According to one embodiment, metal bondpad layer 188 is patterned slightly longer than openings for top and bottom electrode connections. In one embodiment, patterning of metal bondpad layer 188 is carried out using wet etch chemistry based on phosphoric acid. However, other methods may also be used.

Figure 37A:
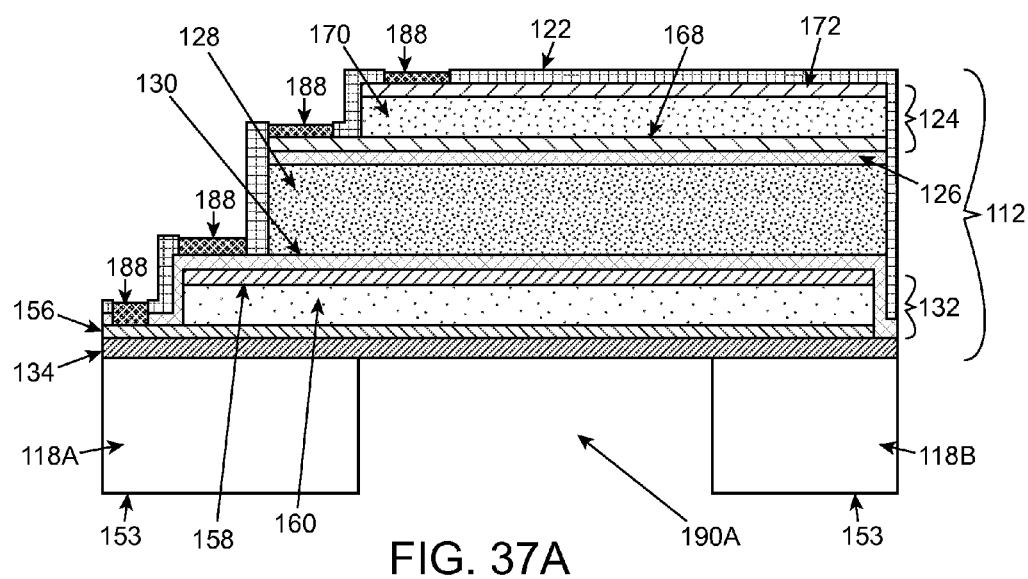
FIGS. 37A-37C are side cross-sectional views of the layered material stack of FIG. 36, in which portions of the of the silicon wafer have been etched to create a resonator beam and one or more base portions, thus creating one embodiment of the device of the present invention which has dual piezoelectric stacks.
Figure 37B:
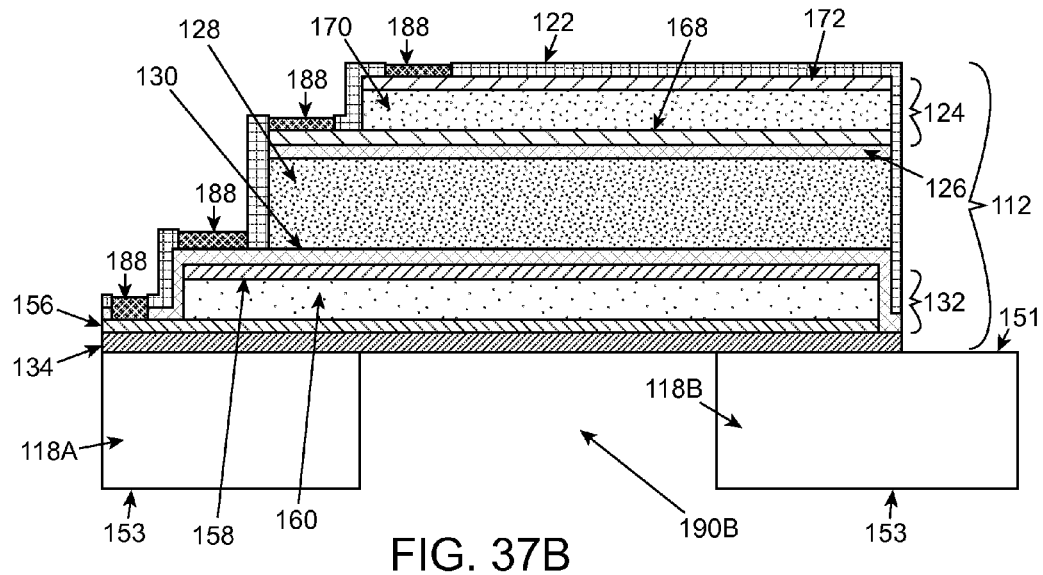
Figure 37C:
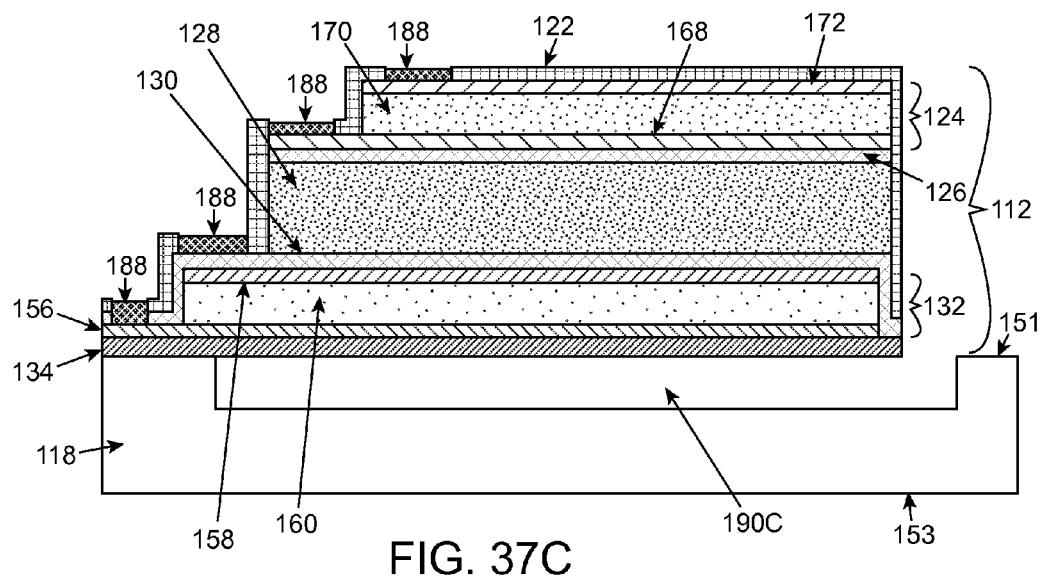

Next, in the method step illustrated in FIGS. 37A-37C, silicon wafer 52 is optionally etched to produce different embodiments of the device. In one embodiment, as shown in FIG. 37A, silicon wafer 152 is etched at surface 153 to create resonator beam 112, first base portion 118A, and second base portion 118B, thus producing one embodiment of the device of the present invention. In other words, portions of silicon wafer 152 are etched away to create a cavity 190A beneath what has become resonator beam 112 to create the separation between the portion of silicon wafer 152 that has become first base portion 118A and the portion of silicon wafer 152 that has become second base portion 118B. According to one embodiment, etching silicon wafer 152 is carried out using lithography techniques and deep reactive ion etch with $SF_6/C_4F_8$ chemistry.

In another embodiment, as shown in FIG. 37B, silicon wafer 152 is etched at surface 153 to create resonator beam 112, first base portion 118A, and second base portion 118B, thus producing one embodiment of the device of the present invention. In other words, portions of silicon wafer 152 are etched away to create a cavity 190B beneath what has become resonator beam 112 to create the separation between the portion of silicon wafer 152 that has become first base portion 118A and the portion of silicon wafer 152 that has become second base portion 118B. Second base portion 118B extends beyond second end 116 of resonator beam 112. According to one embodiment, etching silicon wafer 152 is carried out using lithography techniques and deep reactive ion etch with $SF_6/C_4F_8$ chemistry.

In yet another embodiment, as shown in FIG. 37C, silicon wafer 152 is etched at surface 151 to create resonator beam 112 and base 118, thus producing one embodiment of the device of the present invention. In other words, portions of silicon wafer 152 are etched away to create a cavity 190C beneath what has become resonator beam 112 to create the separation between the portion of silicon wafer 152 that has become base 118 and second end 116 of resonator beam 112. Base 118 extends from first end 114 to second end 116 of resonator beam 112, but is spaced from elongate resonator beam 112 at second end 116. According to one embodiment, etching silicon wafer 152 is carried out using a dry etch such as xenon fluoride or a wet etch such as KOH.

Referring now to FIGS. 38A-42B, the various ways in which resonator beam 12 may be clamped, either fully or partially, to the different base portions will be described (the clamping, although described with respect to the embodiments of the device of the present invention shown in FIGS. 1-3, may be applied in the same manner to the embodiments of the present invention shown in FIGS. 4-6).

Figure 38A:
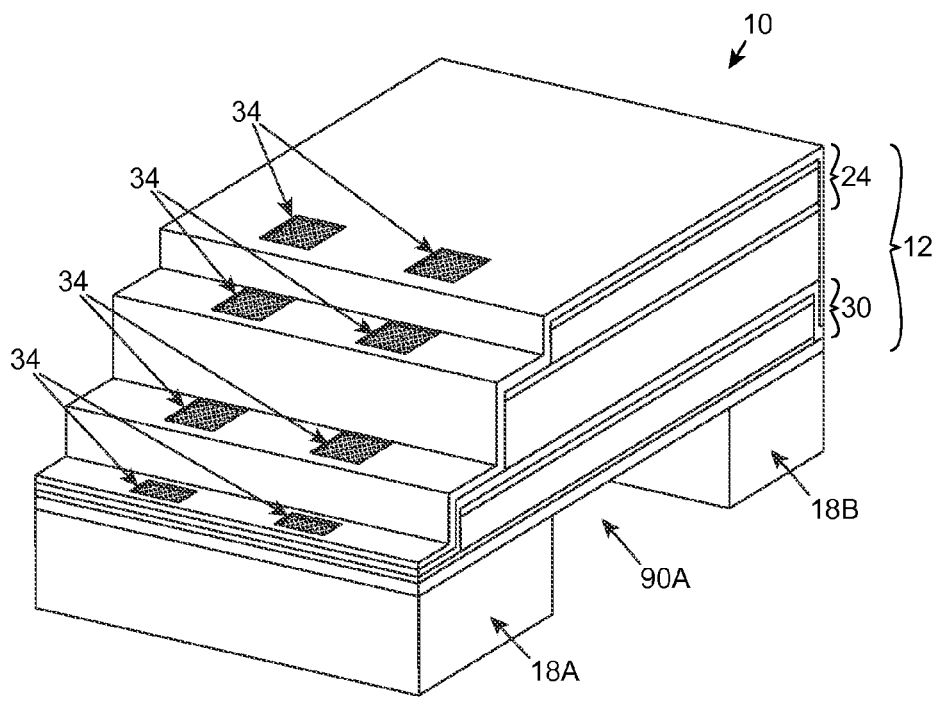
FIGS. 38A and 38B are, respectively, top perspective and bottom partially phantom perspective views of the device of the present invention illustrated in FIG. 1.
Figure 38B:
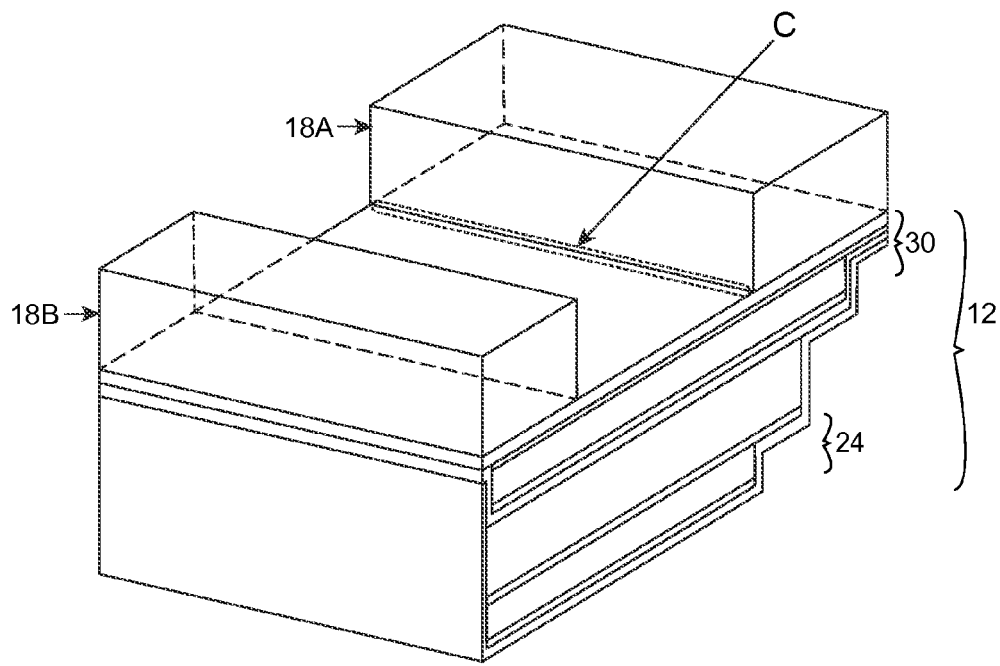

FIGS. 38A and 38B are, respectively, top and bottom perspective views of the embodiment of the device of the present invention shown in FIG. 1. Resonator beam 12 is clamped to first base portion 18A at clamping area C shown in FIG. 38B. In this embodiment, resonator beam 12 freely extends from first base portion 18A as a cantilever, with base portion 18B acting as a mass at the end of the cantilever.

Figure 39A:
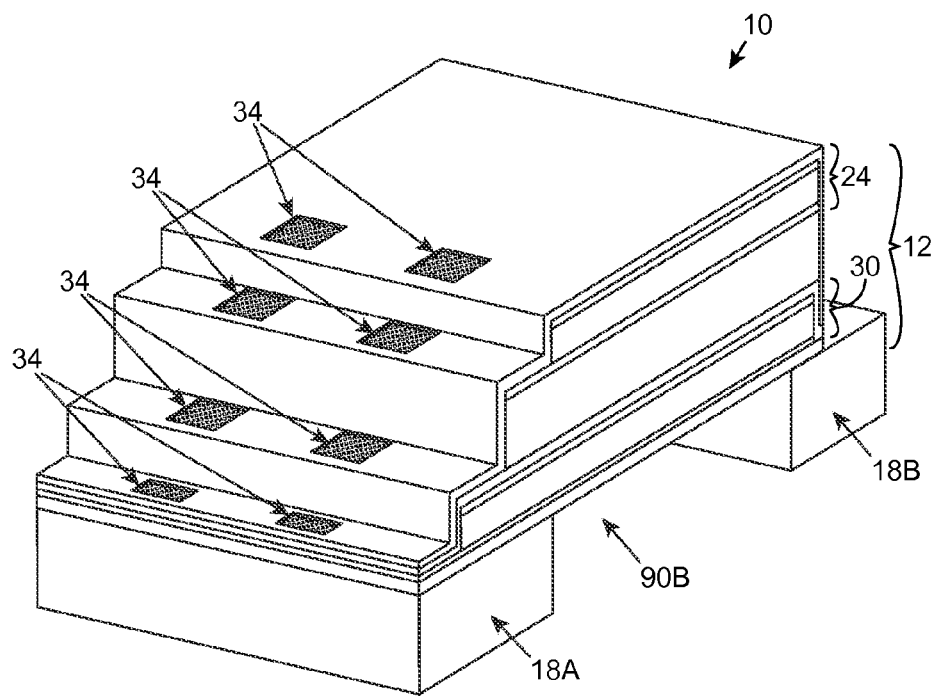
FIGS. 39A and 39B are, respectively, top perspective and bottom partially phantom perspective views of the device of the present invention illustrated in FIG. 2.
Figure 39B:
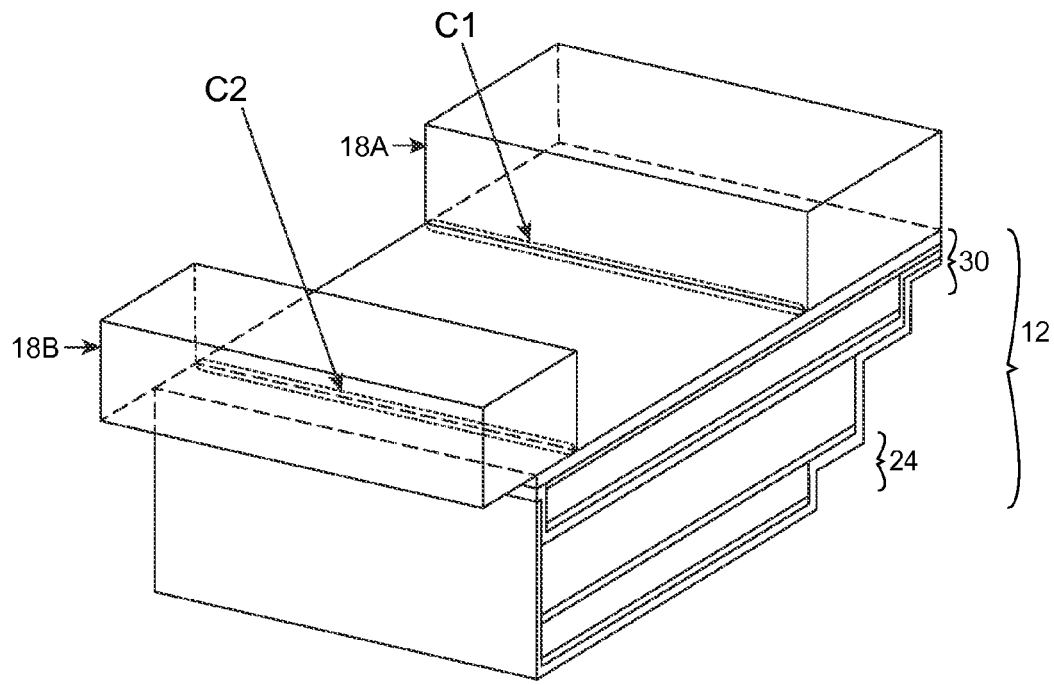

FIGS. 39A and 39 are, respectively, top and bottom perspective views of the embodiment of the device present invention shown in FIG. 2. Resonator beam 12 is clamped to first base portion 18A and second base portion 18B at clamping areas C1 and C2 shown in FIG. 39B.

Figure 40A:
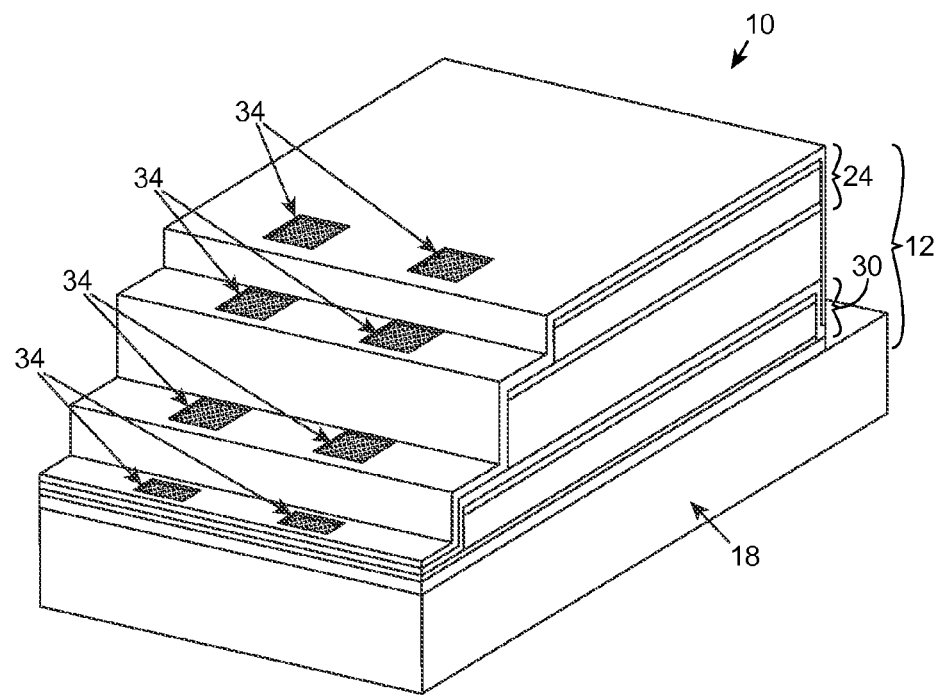
FIGS. 40A-40B are, respectively, top perspective and bottom partially phantom perspective views of the another embodiment of the device of the present invention illustrated in FIG. 2.
Figure 40B:
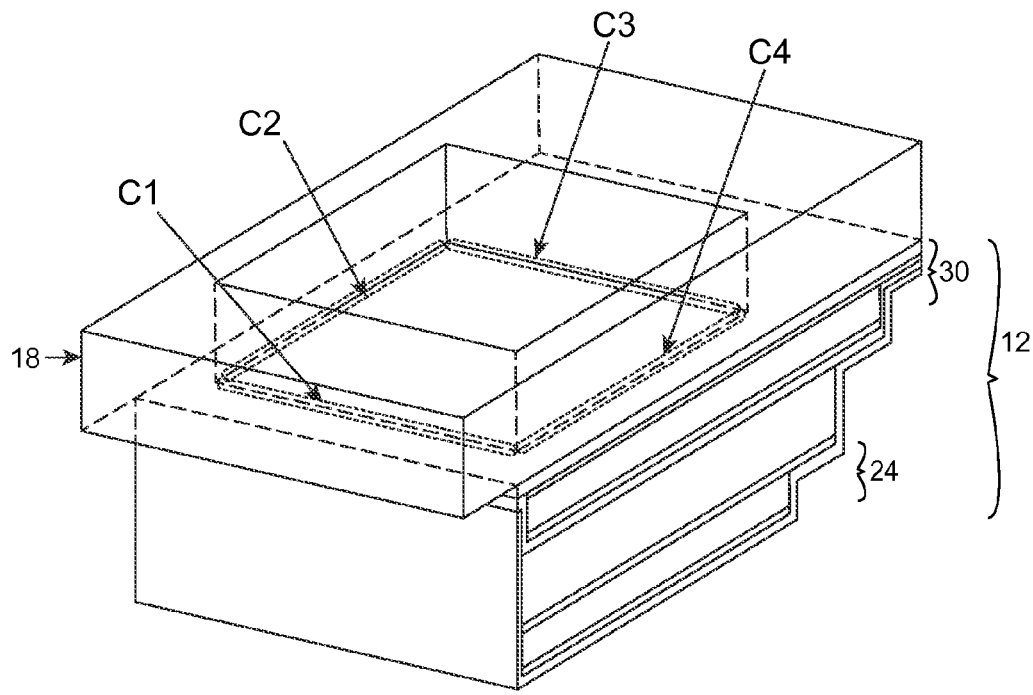

FIGS. 40A and 40B are, respectively, top and bottom perspective views of another embodiment of the device of the present invention shown in FIG. 2. In this embodiment, cavity 90B is formed in base 18 such that resonator beam 12 is additionally clamped along the sides of resonator beam 12 in addition to the clamping at first base portion 18A and second base portion 18B. The clamping is illustrated by clamping areas C1 to C4 in FIG. 40B.

Figure 41A:
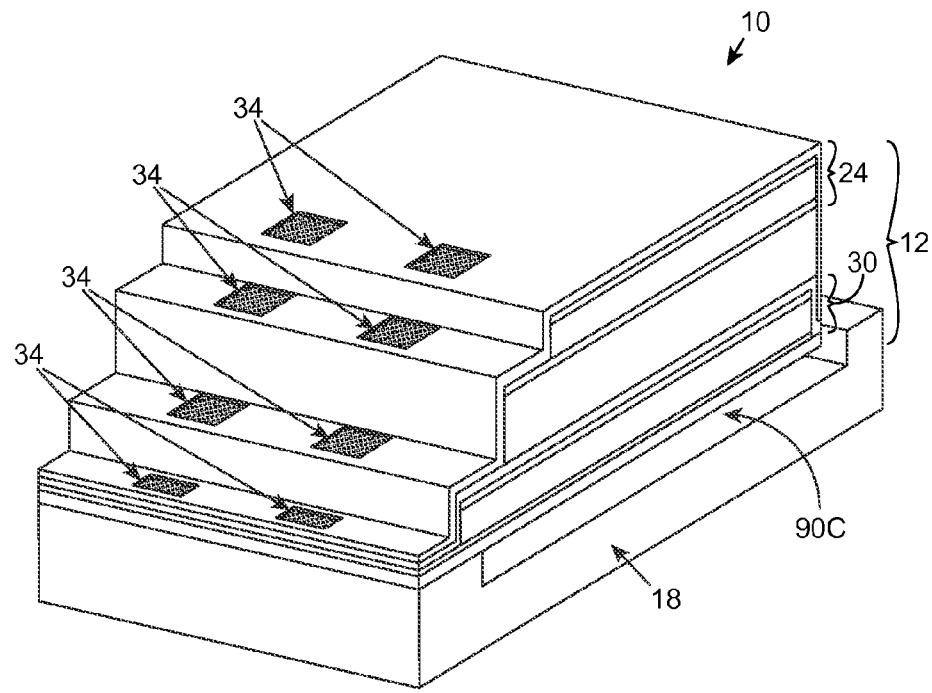
FIGS. 41A-41B are, respectively, a top perspective and bottom partially phantom perspective view of the device of the present invention illustrated in FIG. 3.
Figure 41B:
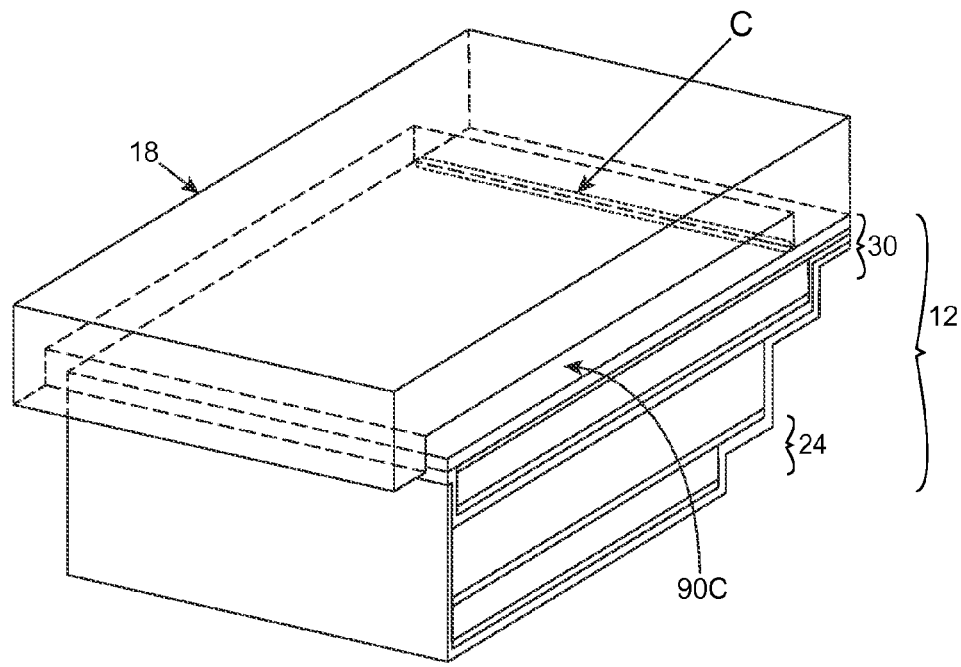
Figure 42A:
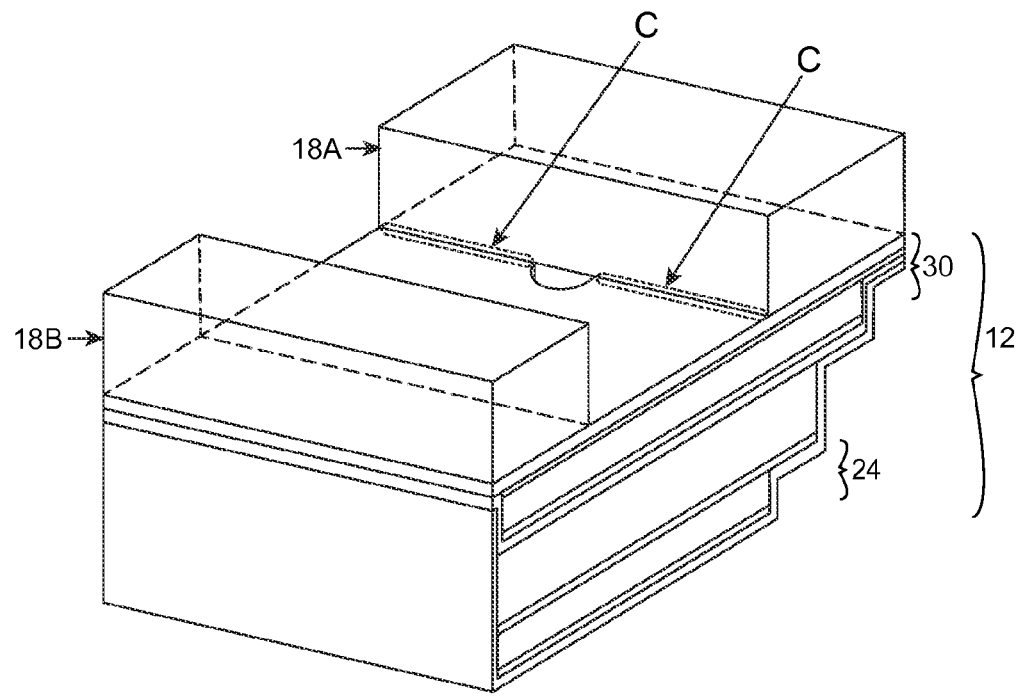
FIGS. 42A-42B are bottom partially phantom views of embodiments of the device of the present invention with partial clamping between the resonator beam and the base.
Figure 42B:
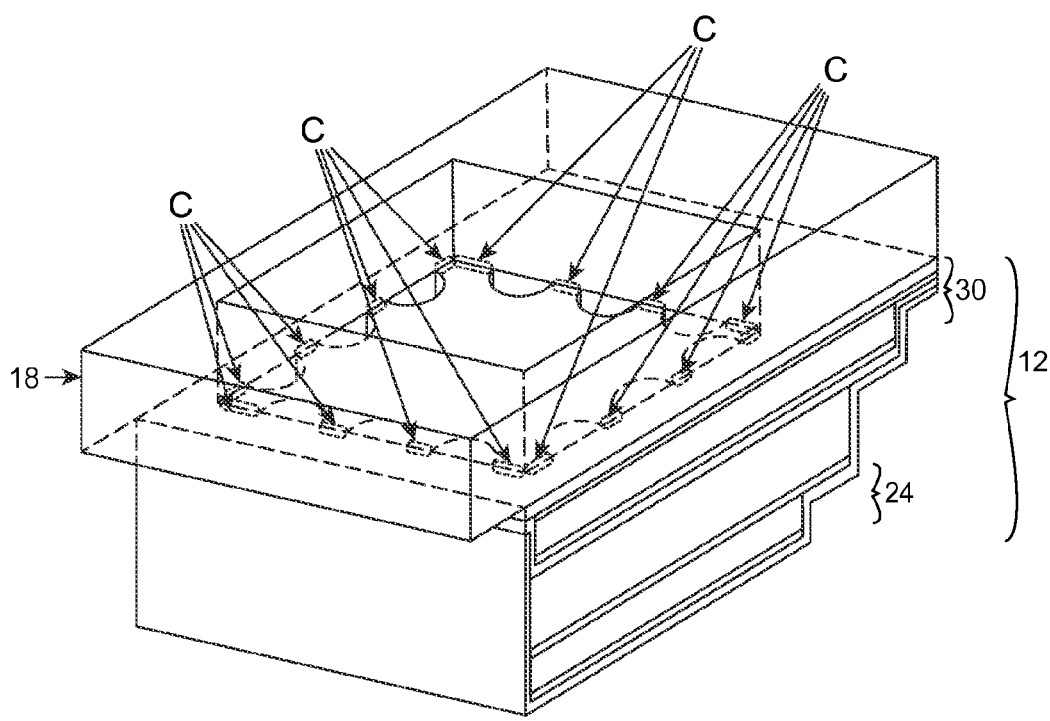

FIGS. 41A and 42B are, respectively, top and bottom perspective views of the embodiment of the device of the present invention shown in FIG. 3. In this embodiment, resonator beam 12 is clamped to one end of base 18 at clamping area C and resonator beam 12 freely extends over cavity 90C as a cantilever.

FIGS. 42A and 42B show partial clamps that may be applied to any of the described embodiments of the present invention. Referring to FIG. 42A, resonator beam 12 is partially clamped to first base portion 18A at clamping areas C. The clamping between resonator beam 12 and first base portion 18A is interrupted by hole 92 which may be formed in the layers of resonator beam 12 during the methods of making the devices described herein by etching the various layers of resonator beam 12. Referring now to FIG. 42B, additional numbers of holes 92 may be located at different areas to provide partial clamping between resonator beam 12 and base 18 at clamping areas C.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:
1. A device comprising
an elongate resonator beam extending between first and second ends and
a base connected to said elongate resonator beam at the first end with the second end extending from said base as a structural layer, wherein said elongate resonator beam comprises either: (1) a first oxide layer on a first piezoelectric stack layer over a structural layer on a second oxide layer over a second piezoelectric stack layer on a third oxide layer or (2) a first oxide layer on a first piezoelectric stack layer over a second oxide layer on a structural layer over a third oxide layer on a second piezoelectric stack over a fourth oxide layer.

2. The device of claim 1, wherein said elongate resonator beam comprises a first oxide layer on a first piezoelectric stack layer over a structural layer on a second oxide layer over a second piezoelectric stack layer on a third oxide layer.

3. The device of claim 1, wherein said elongate resonator beam comprises a first oxide layer on a first piezoelectric stack layer over a second oxide layer on a structural layer over a third oxide layer on a second piezoelectric stack over a fourth oxide layer.

4. The device of claim 1, wherein the second piezoelectric stack layer comprises a conductive material layer over a piezoelectric material layer over a conductive material layer.

5. The device of claim 1, wherein the first piezoelectric stack layer comprises a conductive material layer over a piezoelectric material layer and the structural layer is useful as an electrode.

6. The device of claim 1, wherein the first piezoelectric stack layer comprises a conductive material layer over a piezoelectric material layer on a conductive material layer.

7. The device of claim 1 further comprising:
one or more electrodes in electrical contact with the first and/or second piezoelectric stack layer.

8. The device of claim 7 further comprising:
a display in electrical connection with the one or more electrodes to obtain a reading from the first and/or second piezoelectric stack layer.

9. The device of claim 1, wherein the first and/or second piezoelectric stack layer comprises a conductive material layer wherein the conductive material layer is selected from the group consisting of molybdenum, platinum, and polysilicon.

10. The device of claim 1, wherein the first and/or second piezoelectric stack layer comprises a layer of piezoelectric material, wherein the piezoelectric material is selected from the group consisting of aluminum nitride, zinc oxide, polyvinylidene fluoride, and lead zirconate titanate compounds.

11. The device of claim 1, wherein the structural layer is made from a material selected from the group consisting of electroplated copper or nickel, and polysilicon.

12. The device of claim 1, wherein said base extends without interruption from said first end to said second end.

13. The device of claim 1, wherein said base comprises a first base portion connected to said first end and a second base portion connected to said second end, wherein said first base portion is not in contact with said second base portion.

14. The device of claim 1, wherein said base extends from said first end to said second end but is spaced from said elongate resonator beam at said second end.

15. The device of claim 1, wherein the device comprises a sensor.

16. The device of claim 15, wherein the sensor is selected from the group consisting of an accelerometer, a gyroscope, a pressure sensor, a strain sensor, a flow sensor, or a microphone.

17. The device of claim 1, wherein the device comprises an actuator.

18. The device of claim 17, wherein the actuator is selected from the group consisting of a valve, a pump, or a speaker.

19. The device of claim 1, wherein the device comprises one or more sensors and one or more actuators integrated on a chip.

20. A system comprising:
an apparatus and
the device according to claim 1 electrically coupled to the apparatus.

21. The system according to claim 20, wherein said apparatus is selected from the group consisting of a laptop computer, a tablet computer, a cell phone, a smart phone, an e-reader, an MP3 player, a telephony headset, headphones, a router, a gaming device, a gaming controller, a mobile internet adapter, a camera, wireless sensors, wireless sensor motes, tire pressure sensor monitors, powering simple displays on power tools, devices for raising livestock, medical devices, human body monitoring devices, and toys.

22. The system of claim 20, wherein said elongate resonator beam comprises a first oxide layer on a first piezoelectric stack layer over a structural layer on a second oxide layer over a second piezoelectric stack layer on a third oxide layer.

23. The system of claim 20, wherein said elongate resonator beam comprises a first oxide layer on a first piezoelectric stack layer over a second oxide layer on a structural layer over a third oxide layer on a second piezoelectric stack over a fourth oxide layer.

24. The system of claim 20 further comprising:
one or more electrodes in electrical contact with the first and/or second piezoelectric stack layer.

25. The system of claim 24 further comprising:
circuitry in electrical connection with the one or more electrodes to output and measure electrical energy from the first and/or second piezoelectric stack layer.

26. A method of measuring an environmental condition, said method comprising:
providing the system according to claim 20;
subjecting the system to one or more environmental conditions that generate movement or vibrations to generate electrical energy from the first and/or second piezoelectric stack layer; and
measuring the environmental condition based on said electrical energy from the first and/or second piezoelectric stack layer.

27. The method of claim 26, wherein said apparatus is selected from the group consisting of a laptop computer, a tablet computer, a cell phone, a smart phone, an e-reader, an MP3 player, a telephony headset, headphones, a router, a gaming device, a gaming controller, a mobile internet adapter, a camera, wireless sensors, wireless sensor motes, tire pressure sensor monitors, powering simple displays on power tools, devices for raising livestock, medical devices, human body monitoring devices, and toys.

28. The method of claim 26, wherein said elongate resonator beam comprises a first oxide layer on a first piezoelectric stack layer over a structural layer on a second oxide layer over a second piezoelectric stack layer on a third oxide layer.

29. The method of claim 26, wherein said elongate resonator beam comprises a first oxide layer on a first piezoelectric stack layer over a second oxide layer on a structural layer over a third oxide layer on a second piezoelectric stack over a fourth oxide layer.

30. The method of claim 26, wherein said system further comprises:
one or more electrodes in electrical contact with the first and/or second piezoelectric stack layer.

31. The method of claim 30, wherein said system further comprises:
  circuitry in electrical connection with the one or more electrodes to output electrical energy from the first and/or second piezoelectric stack layer.

32. The method of claim 26, wherein the environmental condition comprises one or more of pressure, vibration, flow rate, strain, physical motion relative to a force, impulse motion, or sound.

33. A method for providing a mechanical actuation force, the method comprising:
  providing the system according to claim 1;
  providing a voltage source in electrical connection with the device;
  applying a voltage to the device from the voltage source, wherein the applied voltage initiates motion of the elongate resonator beam; and
  providing a mechanical actuation force based on the motion of the elongate resonator beam.

34. The method of claim 33 wherein said elongate resonator beam comprises a first oxide layer on a first piezoelectric stack layer over a structural layer on a second oxide layer over a second piezoelectric stack layer on a third oxide layer.

35. The method of claim 33, wherein said elongate resonator beam comprises a first oxide layer on a first piezoelectric stack layer over a second oxide layer on a structural layer over a third oxide layer on a second piezoelectric stack over a fourth oxide layer.

36. The method of claim 33, wherein said system further comprises:
  one or more electrodes in electrical contact with the first and/or second piezoelectric stack layer.

37. The method of claim 36, wherein said system further comprises:
  circuitry in electrical connection with the voltage source and the one or more electrodes to deliver the voltage to the first and/or second piezoelectric stack layer.

* * * * *